US012622055B2

(12) United States Patent
Wang

(10) Patent No.: US 12,622,055 B2
(45) Date of Patent: May 5, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Cheng Wang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 129 days.

(21) Appl. No.: 18/695,698

(22) PCT Filed: Feb. 26, 2024

(86) PCT No.: PCT/CN2024/078546
§ 371 (c)(1),
(2) Date: Mar. 26, 2024

(87) PCT Pub. No.: WO2025/166852
PCT Pub. Date: Aug. 14, 2025

(65) Prior Publication Data
US 2025/0261446 A1     Aug. 14, 2025

(30) Foreign Application Priority Data
Feb. 8, 2024     (CN) ........................ 202410179194.X

(51) Int. Cl.
*H10D 86/40*     (2025.01)
*G09G 3/3233*     (2016.01)
*G09G 3/32*     (2016.01)

(52) U.S. Cl.
CPC ......... *H10D 86/441* (2025.01); *G09G 3/3233* (2013.01); *G09G 3/32* (2013.01);
(Continued)

(58) Field of Classification Search
CPC .............. G09G 3/3233; G09G 3/3241; G09G 2300/043; G09G 2300/0819;
(Continued)

(56) References Cited

U.S. PATENT DOCUMENTS

2014/0132583 A1*  5/2014  Kim ..................... G09G 3/3233
                                                            345/212
2014/0146028 A1*  5/2014  Choi .................... G09G 3/3225
                                                            345/212
(Continued)

FOREIGN PATENT DOCUMENTS

CN      108470539 A     8/2018
CN      114898690 A     8/2022
(Continued)

OTHER PUBLICATIONS

Chinese Office Action issued in corresponding Chinese Patent Application No. 202410179194.X dated Jan. 17, 2025, with English translation.

*Primary Examiner* — Shaheda A Abdin
(74) *Attorney, Agent, or Firm* — HSML P.C.

(57) ABSTRACT

A display panel and a display device are provided. A pixel driving circuit included in the display panel includes a switch transistor, a driving transistor, a compensation transistor, and a first capacitor which are interconnected. A first electrode of the compensation transistor is connected to a gate of the driving transistor, and a compensation gate of the compensation transistor is connected to a first control signal line. A first plate of the first capacitor is connected to the first (Continued)

control signal line, and a second plate of the first capacitor is connected to a first high potential line.

20 Claims, 29 Drawing Sheets

(52) U.S. Cl.
CPC .............. *G09G 2300/0426* (2013.01); *G09G 2300/0852* (2013.01); *G09G 2300/0861* (2013.01); *H10D 86/481* (2025.01)

(58) Field of Classification Search
CPC ... G09G 2300/0842; G09G 2300/0861; G09G 2320/0233; G09G 2330/021; H10D 30/6755; H10D 86/40; H10D 86/421; H10D 86/423; H10D 86/441
See application file for complete search history.

(56) References Cited

U.S. PATENT DOCUMENTS

| | | | |
|---|---|---|---|
| 2017/0365213 A1 * | 12/2017 | Rieutort-Louis | .... G09G 3/3233 |
| 2019/0304367 A1 * | 10/2019 | Li | ........................ G09G 3/3291 |
| 2023/0267888 A1 | 8/2023 | Liu | |
| 2023/0351956 A1 | 11/2023 | Liu et al. | |

FOREIGN PATENT DOCUMENTS

| | | | | |
|---|---|---|---|---|
| CN | 115148143 A | | 10/2022 | |
| CN | 115148153 A | * | 10/2022 | ........... G09G 3/3233 |
| KR | 20140127048 A | * | 11/2014 | ........... G09G 3/3233 |

* cited by examiner

127

Cst2

311

HL0

T3S

333

T4S

Y

334

X

129

321

T3A

P4

T4A

Y

X

131

T3G
331

T4G

Y    332

X

322

DISPLAY PANEL AND DISPLAY DEVICE

TECHNICAL FIELD

The present application relates to afield of display technology, and in particular, to display panel and a display device.

DESCRIPTION OF RELATED ART

Organic light-emitting diode (OLED) display technology is a new type of display technology that has gradually gained attention for its unique advantages of low power consumption, high saturation, fast response time, and wide viewing angle, occupying a certain position in the field of panel display technology.

In related technologies, the pixel driving circuit of an OLED display panel usually includes a switch transistor, a driving transistor, and a compensation transistor. A drain of the switch transistor is connected to a data line, and a gate of the compensation transistor is connected to a control signal line. There is an overlapping area between the data line and the control signal line. When a voltage input to the data line changes, a coupling capacitance between the data line and the control signal line causes a voltage signal on the control signal line to change, resulting in abnormal turning on of the compensation transistor, thereby affecting a potential of the gate of the driving transistor and causing display anomalies of the display panel.

SUMMARY OF INVENTION

The present application provides a display panel and a display device for addressing technical issues of display anomalies of existing display panels.

Accordingly, the present application provides the following technical solutions.

The present application provides a display panel, including a plurality of sub-pixel units, each of the sub-pixel units including a light-emitting device and a pixel driving circuit connected to the light-emitting device, wherein each of the pixel driving circuits includes:

a switch transistor, wherein a first electrode of the switch transistor is connected to a first data signal line, and a second electrode of the switch transistor is connected to a first node;

a driving transistor, wherein a first electrode of the driving transistor is connected to the first node, a second electrode of the driving transistor is connected to a second node, and a drive gate of the driving transistor is connected to a third node;

a compensation transistor, wherein a first electrode of the compensation transistor is connected to the third node, a second electrode of the compensation transistor is connected to the second node, and a compensation gate of the compensation transistor is connected to a first control signal line; and a first capacitor, wherein a first plate of the first capacitor is connected to the first control signal line, and a second plate of the first capacitor is connected to a first high potential line.

The present application further provides a display device. The display device includes a display panel, wherein the display panel includes a plurality of sub-pixel units, and each of the sub-pixel units includes a light-emitting device and a pixel driving circuit connected to the light-emitting device, wherein each of the pixel driving circuits includes:

a switch transistor, wherein a first electrode of the switch transistor is connected to a first data signal line, and a second electrode of the switch transistor is connected to a first node;

a driving transistor, wherein a first electrode of the driving transistor is connected to the first node, a second electrode of the driving transistor is connected to a second node, and a drive gate of the driving transistor is connected to a third node;

a compensation transistor, wherein a first electrode of the compensation transistor is connected to the third node, a second electrode of the compensation transistor is connected to the second node, and a compensation gate of the compensation transistor is connected to a first control signal line; and a first capacitor, wherein a first plate of the first capacitor is connected to the first control signal line, and a second plate of the first capacitor is connected to a first high potential line.

DETAILED DESCRIPTION OF EMBODIMENTS OF THE INVENTION

Figure 1:
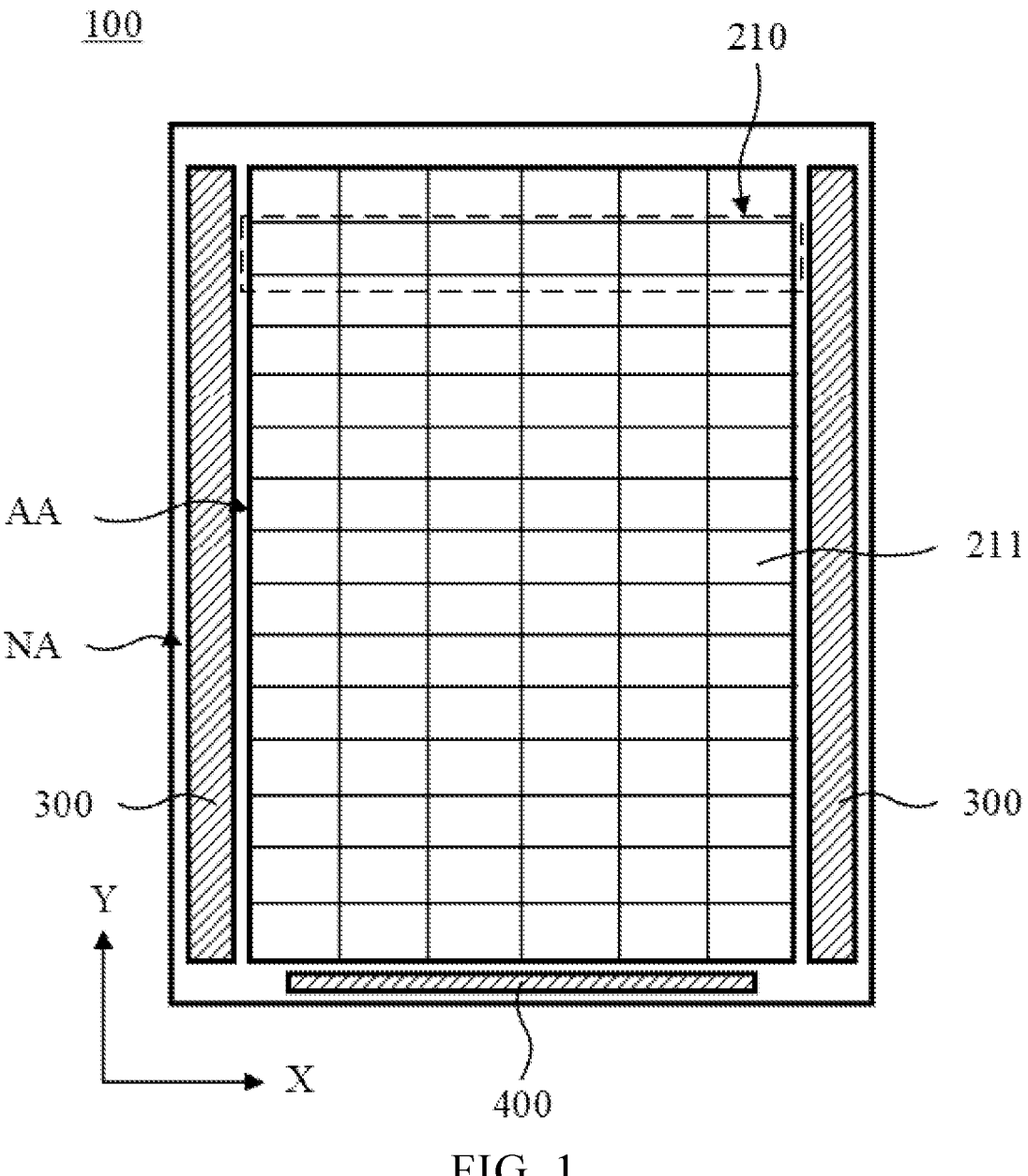
FIG. 1 is a schematic structural view of a display panel in the present application.

The following provides a clear and comprehensive description of the technical solutions in the embodiments of the present application, in conjunction with the drawings included in the embodiments of the application. It is evident that the described embodiments are only a part of the embodiments of the application and not all of them. Based on the embodiments in this application, all other embodiments obtained by those skilled in the art without making creative efforts fall within the protection scope of this application. Moreover, it should be understood that the specific embodiments described here are only for illustrating and explaining this application and not for limiting this application. In this application, unless stated otherwise, orientation terms such as "upper" and "lower" generally refer to the direction above and below when the device is in actual use or working state, specifically, the directions in the drawings; whereas "inner" and "outer" refer to the outline of the device.

Referring to FIGS. 1 to 30, the present application provides a display panel 100. The display panel 100 can include a display part 200, and a gate driving circuit 300 located on one side of the display part 200. The gate driving circuit 300 is used to input control signals to the display part 200.

In the present embodiment, referring to FIG. 1, the display part 200 comprises a plurality of sub-pixel rows 210. Each sub-pixel row 210 includes a plurality of sub-pixel units 211. Each sub-pixel unit 211 is provided with a light-emitting device 211$b$ and a pixel driving circuit 211$a$ connected to the light-emitting device 211$b$. The gate driving circuit 300 is used to input gate control signals to transistors in the pixel driving circuit 211$a$.

In the present embodiment, the pixel driving circuit 211$a$ can include a switch transistor T2, a driving transistor T1, and a compensation transistor T3, which are interconnected. A first electrode of the switch transistor T2 is connected to a first data signal line Data1, and a second electrode of the switch transistor T2 is connected to a first node A. A first electrode of driving transistor T1 is connected to the first node A, and a second electrode of driving transistor T1 is connected to a second node B. A drive gate T1G of the driving transistor T1 is connected to a third node Q. A first electrode of the compensation transistor T3 is connected to the third node Q, and a second electrode of the compensation transistor T3 is connected to the second node B. A compensation gate T3G of the compensation transistor T3 is connected to a first control signal line Nscan1.

In the present embodiment, the pixel driving circuit 211$a$ further includes a first capacitor C1. A first plate of the first capacitor C1 is connected to the first control signal line Nscan1, and a second plate of the first capacitor C1 is connected to a first high potential line VDD1.

By setting the first capacitor C1 between the first control signal line Nscan1 and the first high potential line VDD1, and utilizing a high potential of the first high potential line VDD1 to enhance the anti-coupling capability of the first control signal line Nscan1, the stability of the control signal transmitted by the first control signal line Nscan1 is improved. This approach avoids abnormal activation of the compensation transistor T3, ensures the stability of a potential of the gate of the driving transistor T1, and addresses the technical issue of display anomalies in the display panel 100.

It should be noted that the light-emitting device 211$b$ in this application can be an organic light-emitting diode (OLED), a Mini LED, a Micro LED, a regular-sized LED, or other light sources.

The technical solution of this application is described in conjunction with specific embodiments.

Referring to FIG. 1, the display panel 100 includes a display area AA and a non-display area NA adjacent to the display area AA, with a display part 200 situated in the display area AA. Optionally, the non-display area NA surrounds the display area AA, enclosing the display area AA. The display area AA is a region within the display panel 100 that performs the display function, containing multiple sub-pixel units 211 to fulfill the display function. The non-display area NA can be a frame region of the display panel 100, with functional components provided in the frame region to assist the display function of the sub-pixel units 211 within the display area AA.

Referring to FIG. 1, bonding terminals 400 are arranged on a lower side of the display area AA. The bonding terminals 400 can connect to external circuits. The bonding terminals 400 transmit signals input from the external circuits to the data lines, thereby driving the display panel 100 to display images. For example, the bonding terminals 400 can be bonded to a chip or a flip-chip film, providing power supply and driving signals for the display panel 100.

In the present embodiment, the gate driving circuit 300 is situated in the non-display area NA, as well as on two sides of the display area AA. The gate driving circuit 300 can include cascaded multiple gate driving units, which can be arranged in a first direction X. The structure of the gate driving units is not specifically limited in this application.

In the present embodiment, multiple light-emitting devices 211*b* and pixel driving circuits 211*a* that drive these light-emitting devices are arranged in an array in the display area AA. The pixel driving circuits 211*a* can vary in configuration, including 7T1C (7 transistors, 1 capacitor), 7T2C (7 transistors, 2 capacitors), 8T2C (8 transistors, 2 capacitors), 8T3C (8 transistors, 3 capacitors), 8T4C (8 transistors, 4 capacitors), etc. In the following embodiment, the 8T3C pixel driving circuit 211*a* is used as an example to illustrate.

Figure 2:
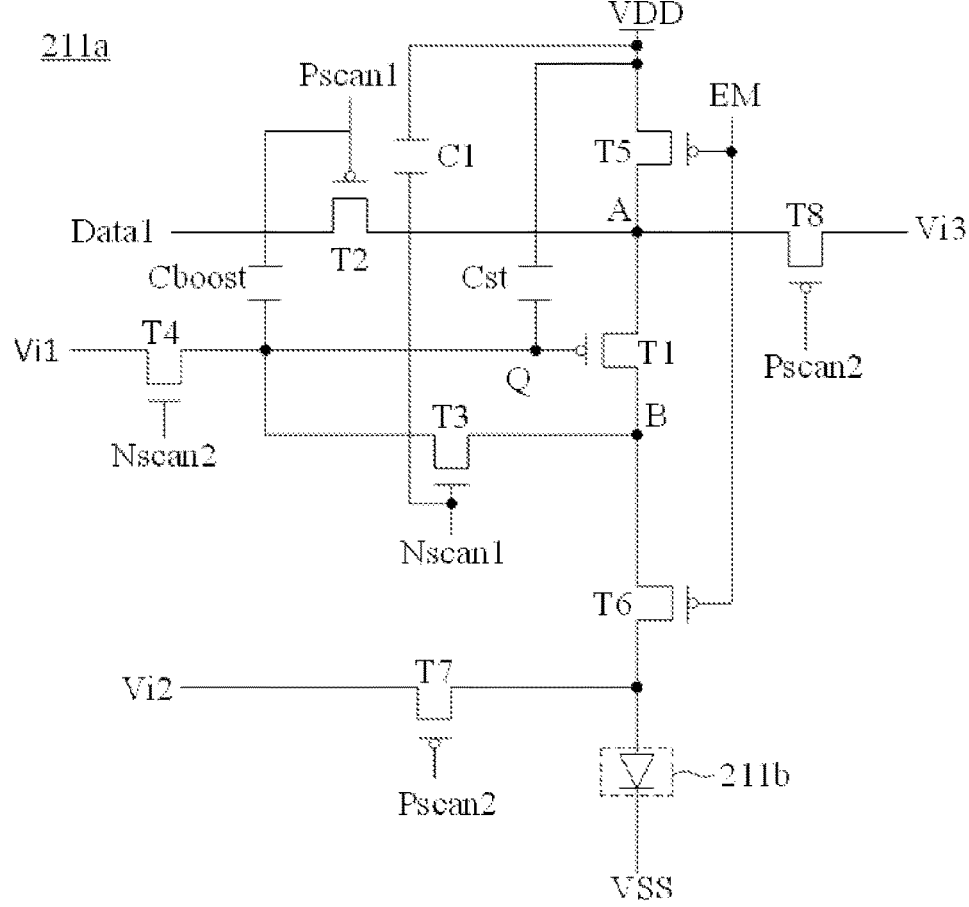
FIG. 2 is an equivalent circuit diagram of a pixel driving circuit in the display panel of the present application.

Referring to FIG. 2, the pixel driving circuit 211*a* can include a switch transistor T2, a driving transistor T1, a compensation transistor T3, a first reset transistor T4, a second reset transistor T7, a third reset transistor T8, a first light-emitting transistor T5, a second light-emitting transistor T6, a first capacitor C1, a boost capacitor Cboost, and a storage capacitor Cst. The first capacitor C1 consists of a first plate and a second plate. The storage capacitor Cst includes a third plate Cst1 and a fourth plate Cst2. The boost capacitor Cboost comprises a fifth plate and a sixth plate.

Referring to FIG. 2, a first electrode of the switch transistor T2 is connected to a first data signal line Data1, and a second electrode of the switch transistor T2 is connected to a first node A. A switch gate T2G of the switch transistor T2 is connected to a second control signal line Pscan1. A first electrode of the driving transistor T1 is connected to the first node A, a second electrode of the driving transistor T1 is connected to a second node B, and a drive gate T1G of the driving transistor T1 is connected to a third node Q. A first electrode of the compensation transistor T3 is connected to the third node Q, a second electrode of the compensation transistor T3 is connected to the second node B, and a compensation gate T3G of the compensation transistor T3 is connected to a first control signal line Nscan1. A first electrode of the first reset transistor T4 is connected to a first reset signal line Vi1, a second electrode of the first reset transistor T4 is connected to the third node Q, and a first reset gate T4G of the first reset transistor T4 is connected to a third control signal line Nscan2. A first electrode of the second reset transistor T7 is connected to the second reset signal line Vi2, a second electrode of the second reset transistor T7 is connected to an anode of the light-emitting device 211*b*, and a second reset gate T7G of the second reset transistor T7 is connected to a fourth control signal line Pscan2. A first electrode of the third reset transistor T8 is connected to a third reset signal line Vi3, a second electrode of the third reset transistor T8 is connected to the first node A, and a third reset gate T8G of the third reset transistor T8 is connected to a fourth control signal line Pscan2. A first electrode of the first light-emitting transistor T5 is connected to a first high potential line VDD1, a second electrode of the first light-emitting transistor T5 is connected to the first node A, and a first light-emitting gate T5G of the first light-emitting transistor T5 is connected to a light-emitting signal line EM. A first electrode of the second light-emitting transistor T6 is connected to the second node B, a second electrode of the second light-emitting transistor T6 is connected to the anode of the light-emitting device 211*b*, and a second light-emitting gate T6G of the second light-emitting transistor T6 is connected to the light-emitting signal line EM. A fifth plate of the boost capacitor Cboost is connected to the third node Q, and a sixth plate of the boost capacitor Cboost is connected to the second control signal line Pscan1. The third plate Cst1 of the storage capacitor Cst is connected to the third node Q, and the fourth plate Cst2 of the storage capacitor Cst is connected to the first high potential line VDD1. The first plate of the first capacitor C1 is connected to the first control signal line Nscan1, and the second plate of the first capacitor C1 is connected to the first high potential line VDD1. A cathode of the light-emitting device 211*b* is connected to the first low potential line VSS.

It should be noted that for the switch transistors T2 in different sub-pixel units 211, they are connected to different data signal lines. The present application only takes one of them as an example for description.

In the present embodiment, the first high potential line VDD1 is used to provide a constant high voltage level to the pixel driving circuit 211*a*, and the first low potential line VSS is used to provide a constant low voltage level to the pixel driving circuit 211*a*.

In the present embodiment, the switch transistor T2, the driving transistor T1, the second reset transistor T7, the third reset transistor T8, the first light-emitting transistor T5, and the second light-emitting transistor T6 can be either P-type or N-type transistors. The compensation transistor T3 and the first reset transistor T4 can be of the other type. This application illustrates with the switch transistor T2, the driving transistor T1, the second reset transistor T7, the third reset transistor T8, the first light-emitting transistor T5, and the second light-emitting transistor T6 as P-type transistors, and the compensation transistor T3 and the first reset transistor T4 as N-type transistors as an example.

In the present embodiment, a capacitance value of the first capacitor C1 is less than a capacitance value of the storage capacitor Cst, and a capacitance value of the boost capacitor Cboost is also less than the capacitance value of the storage capacitor Cst. The storage capacitor Cst in this embodiment primarily serves to maintain the stability of a potential at the third node Q, and therefore, has a larger capacitance. For example, the capacitance value of the storage capacitor Cst can be in a range from 45 fF to 55 fF, while the capacitance values of the boost capacitor Cboost and the first capacitor C1 can be in a range from 5 fF to 15 fF.

In the present embodiment, the first electrode can be either a source or a drain, and the second electrode can be the other of the source and the drain.

In the following embodiment, an angle between the first direction X and the second direction Y is greater than 0 and less than or equal to 90 degrees, for instance, with the first direction X being horizontal and the second direction Y being vertical.

In the following, the film layer structure of the pixel driving circuit 211*a*, as depicted in FIG. 2, is described.

Figure 3:
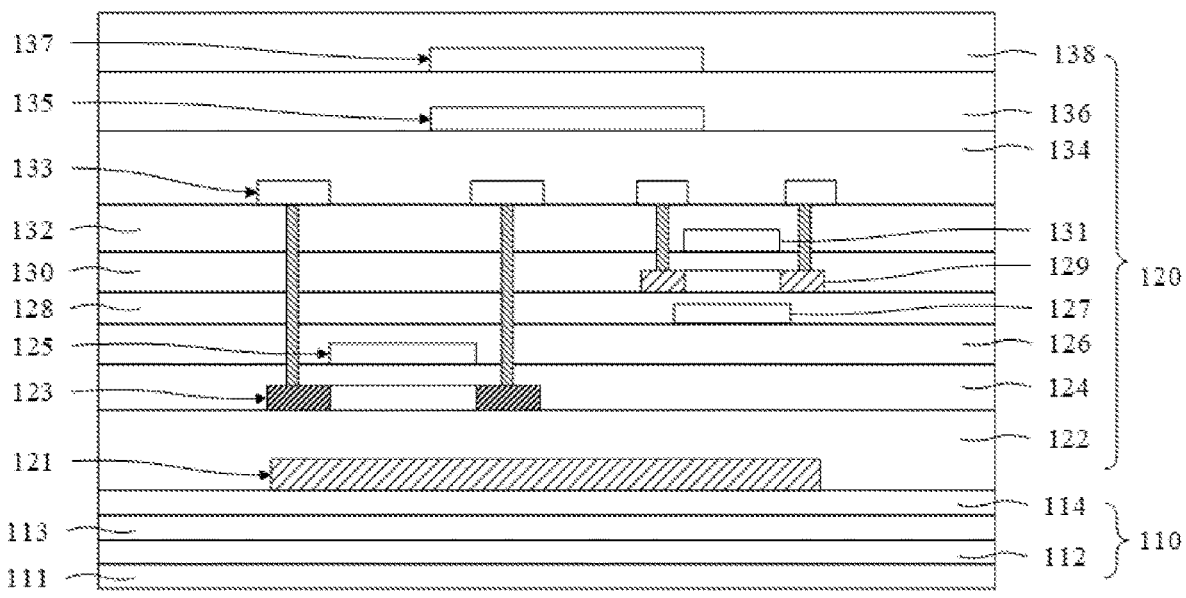
FIG. 3 is a schematic film layer view of the display panel of the present application.

Refer to FIG. 3, where the display area AA and the non-display area NA of the display panel 100 can include a base substrate 110 and an array driving layer 120 placed on the base substrate 110. In the display area AA, the display panel 100 can also have a pixel definition layer (not illustrated) set on the array driving layer 120, a light-emitting device layer (not illustrated) arranged in the same layer as the pixel definition layer, and an encapsulation layer (not illustrated) set on the pixel definition layer. The following mainly describes the film layer structure in the display area AA.

In the present embodiment, the base substrate 110 supports various layers positioned on it. When the display panel 100 is a bottom-emission or double-side emission light-emitting display device, a transparent base substrate is used.

For top-emission light-emitting display devices, a semi-transparent, opaque, or transparent base substrate can be employed.

In the present embodiment, the base substrate 110 is utilized to support the various film layers set upon it and can be made of insulating materials such as glass, quartz, or polymer resin. The base substrate 110 can be either a rigid substrate or a flexible substrate that can be bent, folded, or rolled. Examples of flexible materials for the flexible substrate include polyimide (PI), but are not limited to polyimide (PI).

In this embodiment, the base substrate 110 may include a stack of a first flexible substrate 111, a first barrier layer 112, a second flexible substrate 113, and a second barrier layer 114. The first flexible substrate 111 and the second flexible substrate 113 can be made of the same material, such as polyimide. The first barrier layer 112 and the second barrier layer 114 can be formed of inorganic materials, including at least one of SiOx and SiNx.

In the present embodiment, the first flexible substrate 111 is formed by coating a polymer material on a supporting base (not illustrated) and then curing the polymer material. The second flexible substrate 113 is formed by coating a material identical to the material of the first flexible substrate 111 and curing it. The process to form the second flexible substrate 113 is the same as the process used to form the first flexible substrate 111. Each of the first and second flexible substrates 111 and 113 can be formed to have a thickness of approximately 8 μm to 12 μm. Furthermore, when the base substrate 110 is formed of the first and second flexible substrates 111 and 113, any small holes, cracks, etc., formed during the manufacturing of the first flexible substrate 111 are covered by the second flexible substrate 113, thereby eliminating such defects.

Referring to FIG. 3, the array driving layer 120 can include multiple thin-film transistors (TFTs). These TFTs can be of the etch stop type, back-channel etched type, or categorized based on the position of the gate relative to the active layer as bottom gate TFTs, top gate TFTs, etc. Additionally, TFTs can be classified based on their electrical properties as N-type TFTs or P-type TFTs. It should be noted that the TFTs in FIG. 3 do not represent the structural diagram of any transistor in FIG. 2 but are merely schematic diagrams illustrating the various film layers of the display panel 100 in this application.

Referring to FIG. 3, the array driving layer 120 can include several layers placed on the base substrate 110: a light-blocking layer 121 set on the base substrate 110, a buffer layer 122 set on the light-blocking layer 121, a first active layer 123 set on the buffer layer 122, a first gate insulating layer 124 set on the first active layer 123, a first gate layer 125 set on the first gate insulating layer 124, a second gate insulating layer 126 set on the first gate layer 125, a second gate layer 127 on the second gate insulating layer 126, a third gate insulating layer 128 set on the second gate layer 127, a second active layer 129 set on the third gate insulating layer 128, a fourth gate insulating layer 130 set on the second active layer 129, a third gate layer 131 set on the fourth gate insulating layer 130, a first interlayer insulating layer 132 set on the third gate layer 131, a first source-drain layer 133 set on the first interlayer insulating layer 132, a second interlayer insulating layer 134 set on the first source-drain layer 133, a second source-drain layer 135 set on the second interlayer insulating layer 134, a third interlayer insulating layer 136 set on the second source-drain layer

135, a third source-drain layer 137 set on the third interlayer insulating layer 136, and a planarization layer 138 set on the third source-drain layer 137.

Referring to FIG. 3, the light-blocking layer 121 is set on the second barrier layer 114. The light-blocking layer 121 is used to prevent external light from entering the thin-film transistors from below. A material of the light-blocking layer 121 can consist of black light-blocking materials, such as black metal or black organic materials, for example.

Referring to FIG. 3, the buffer layer 122 is set on the light-blocking layer 121. The buffer layer 122 serves to isolate the light-blocking layer 121 from the upper metal materials. A material of the buffer layer 122 can include compounds composed of nitrogen, silicon, and oxygen elements, such as a single layer of silicon oxide film, or a stacked structure of silicon oxide and silicon nitride.

Referring to FIG. 3, the first active layer 123 is set on the buffer layer 122, and the second active layer 129 can be set on the third gate insulating layer 128. Materials for the first active layer 123 and the second active layer 129 can be indium gallium zinc oxide semiconductor, amorphous silicon, or low-temperature polysilicon. For example, in this application, the material for the first active layer 123 can be low-temperature polysilicon, and the material for the second active layer 129 can be an indium gallium zinc oxide semiconductor.

Referring to FIG. 3, the first gate insulating layer 124, the second gate insulating layer 126, the third gate insulating layer 128, the fourth gate insulating layer 130, the first interlayer insulating layer 132, the second interlayer insulating layer 134, and the third interlayer insulating layer 136 are respectively disposed on corresponding metal layers or semiconductor layers, separately isolating different layers of metal or semiconductor. Materials for the first gate insulating layer 124, the second gate insulating layer 126, the first interlayer insulating layer 132, the third gate insulating layer 128, the fourth gate insulating layer 130, the second interlayer insulating layer 134, and the third interlayer insulating layer 136 can be inorganic compounds composed of silicon nitride, or organic materials with planarization properties.

Referring to FIG. 3, the first gate layer 125, the second gate layer 127, and the third gate layer 131 are respectively positioned on corresponding insulating layers. Materials for the first gate layer 125, the second gate layer 127, and the third gate layer 131 can include copper, molybdenum, or molybdenum-titanium alloys.

Referring to FIG. 3, the first source-drain layer 133 is positioned on the first interlayer insulating layer 132, the second source-drain layer 135 is placed on the second interlayer insulating layer 134, and the third source-drain layer 137 is located on the third interlayer insulating layer 136. Materials for the first source-drain layer 133, the second source-drain layer 135, and the third source-drain layer 137 can include copper, molybdenum, molybdenum-titanium alloy, or a titanium-aluminum-titanium triple-layer metal, etc.

Referring to FIG. 3, the planarization layer 138 is laid out entirely to ensure the flatness of the film layers of the array driving layer 120. A material for the planarization layer 138 can consist of inorganic compounds composed of silicon nitride, or organic materials with planarization properties.

Figure 4:
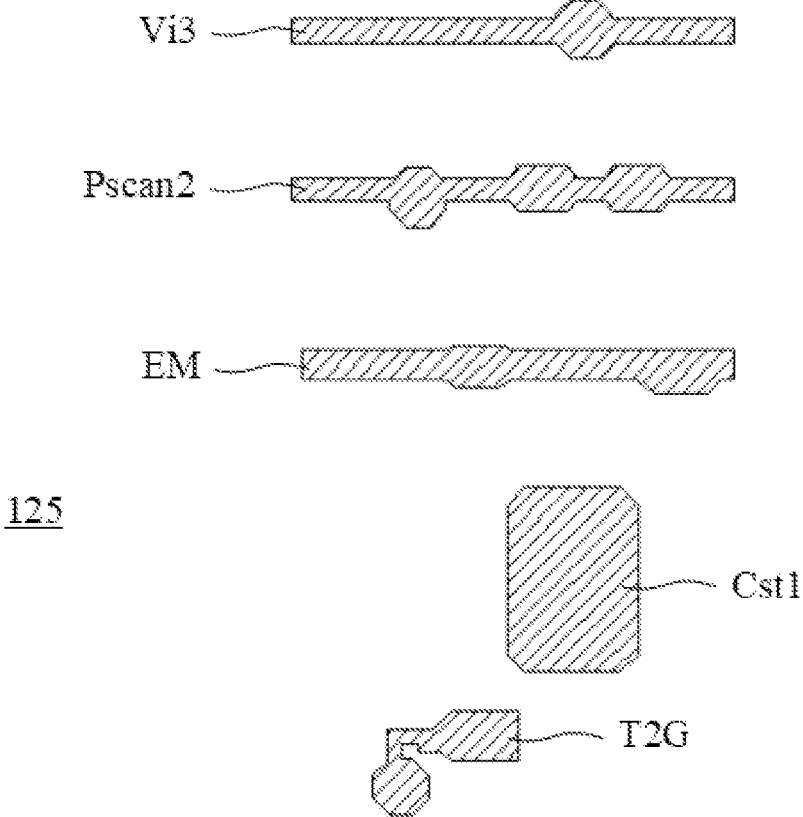
FIG. 4 is a film layer diagram of a first gate layer in the display panel of the present application.
Figure 4:
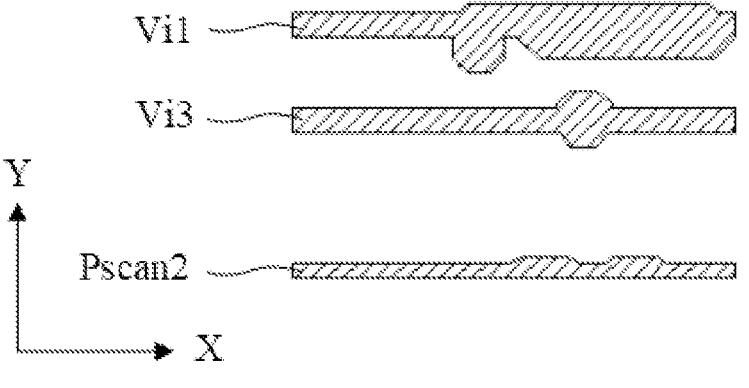

Referring to FIG. 4, the first gate layer 125 includes the light-emitting signal line EM, the first reset signal line Vi1, the third reset signal line Vi3, the fourth control signal line Pscan2, the light-emitting signal line EM, the first reset signal line Vi1, the third reset signal line Vi3, and the fourth control signal line Pscan2, all extending along the first direction X. The third reset signal line Vi3, the fourth control signal line Pscan2, the light-emitting signal line EM, and the first reset signal line Vi1 are arranged at intervals along the second direction Y.

Referring to FIG. 4, the first gate layer 125 also includes the switch gate T2G and the third plate Cst1 of the storage capacitor Cst, which are situated between the light-emitting signal line EM and the first reset signal line Vi1. The switch gate T2G and the third plate Cst1 are spaced apart along the second direction Y, with the third plate Cst1 positioned closer to the light-emitting signal line EM, while the switch gate T2G is positioned further away from the light-emitting signal line EM.

In the present embodiment, the light-emitting signal line EM can directly serve as the first light-emitting gate T5G and the second light-emitting gate T6G. Similarly, the fourth control signal line Pscan2 can directly serve as the second reset gate T7G and the third reset gate T8G.

Referring to FIG. 4, the switch gate T2G and the third plate Cst1 can be rectangular-shaped, and all four corners of the third plate Cst1 can be chamfered.

Figure 5:
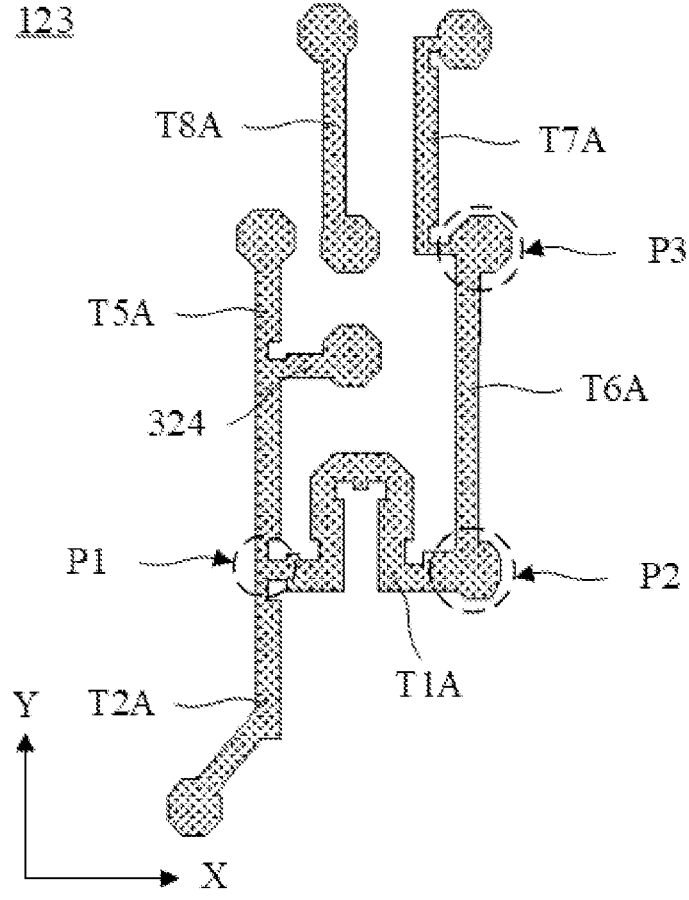
FIG. 5 is a film layer diagram of a first active layer in the display panel of the present application.

Referring to FIG. 5, the first active layer 123 includes a switch active part T2A of the switch transistor T2, a drive active part T1A of the driving transistor T1, a second reset active part T7A of the second reset transistor T7, a third reset active part T8A of the third reset transistor T8, a first light-emitting active part T5A of the first light-emitting transistor T5, and a second light-emitting active part T6A of the second light-emitting transistor T6.

Referring to FIG. 5, the switch active part T2A, the drive active part T1A, the second reset active part T7A, the first light-emitting active part T5A, and the second light-emitting active part T6A are interconnected. The third reset active part T8A is set apart from the other active parts. The switch active part T2A, the second reset active part T7A, the third reset active part T8A, the first light-emitting active part T5A, and the second light-emitting active part T6A are all elongated and extend along the second direction Y The drive active part T1A is inverted-U-shaped and positioned between the first light-emitting active part T5A and the second light-emitting active part T6A. A first end of the switch active part T2A, a first end of the drive active part T1A, and a first end of the first light-emitting active part T5A are connected at a first connection point P1. A second end of the drive active part T1A and a first end of the second light-emitting active part T6A are connected at a second connection point P2. A first end of the second reset active part T7A and a second end of the second light-emitting active part T6A are connected at a third connection point P3.

In the present embodiment, the first connection point P1 is designated as the first node A, the second connection point P2 as the second node B, and the third connection point P3 as a point where the anode of the light-emitting device 211b is located.

Figure 6:
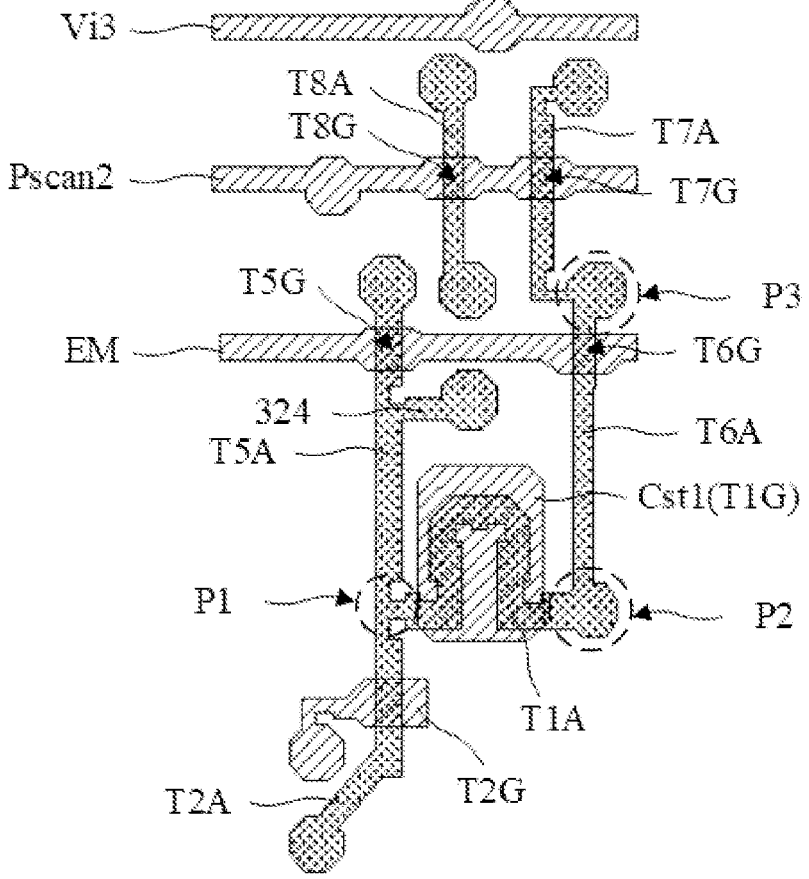
FIG. 6 is a laminated film layer diagram of the first gate layer and the first active layer in the display panel of the present application.
Figure 6:
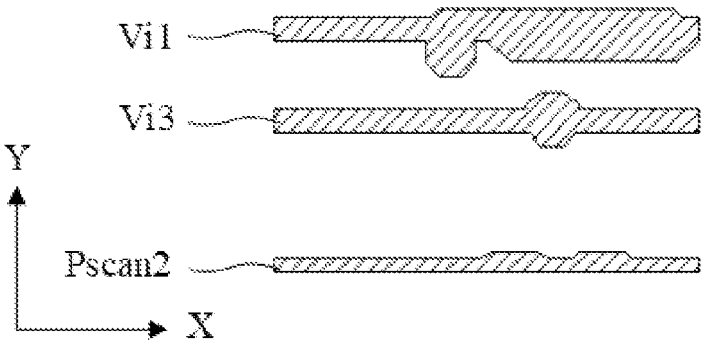

Referring to FIG. 6, the light-emitting signal line EM partially overlaps with the first light-emitting active part T5A, and this overlapping portion serves as a channel of the first light-emitting active part T5A. The light-emitting signal line EM also partially overlaps with the second light-emitting active part T6A, and this overlapping portion serves as a channel of the second light-emitting active part T6A. The switch gate T2G partially overlaps with the switch active part T2A, and this overlapping portion serves as a channel of the switch active part T2A. The fourth control signal line Pscan2 partially overlaps with the second reset active part T7A, and this overlapping portion serves as a channel of the second reset active part T7A. The fourth control signal line Pscan2 partially overlaps with the third reset active part T8A, and this overlapping portion serves as a channel of the third reset active part T8A. The drive active part T1A partially overlaps with the third plate Cst1, and this overlapping portion serves as a channel of the drive active part T1A. In this application, the third plate Cst1 is repurposed as the drive gate T1G of the driving transistor T1.

Figure 7:
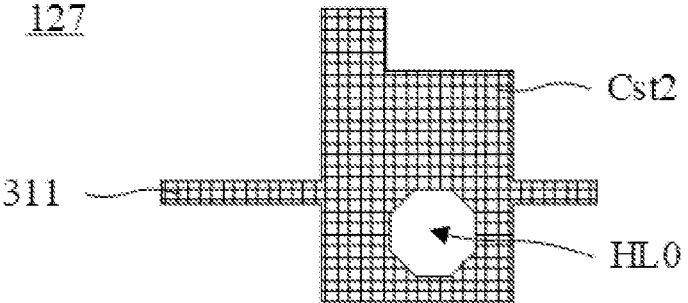
FIG. 7 is a film layer diagram of a second gate layer in the display panel of the present application.
Figure 7:
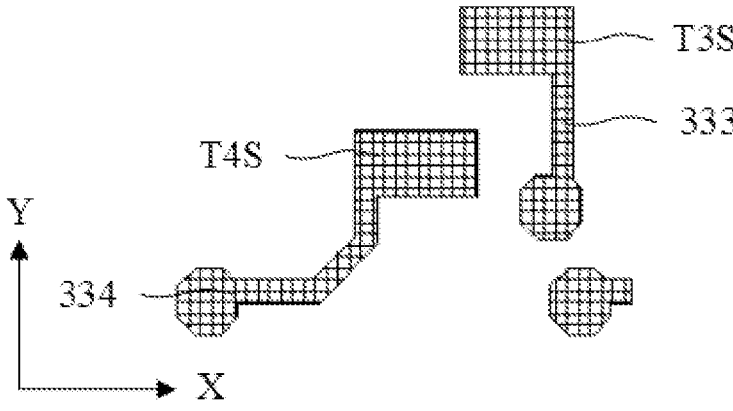
Figure 8:
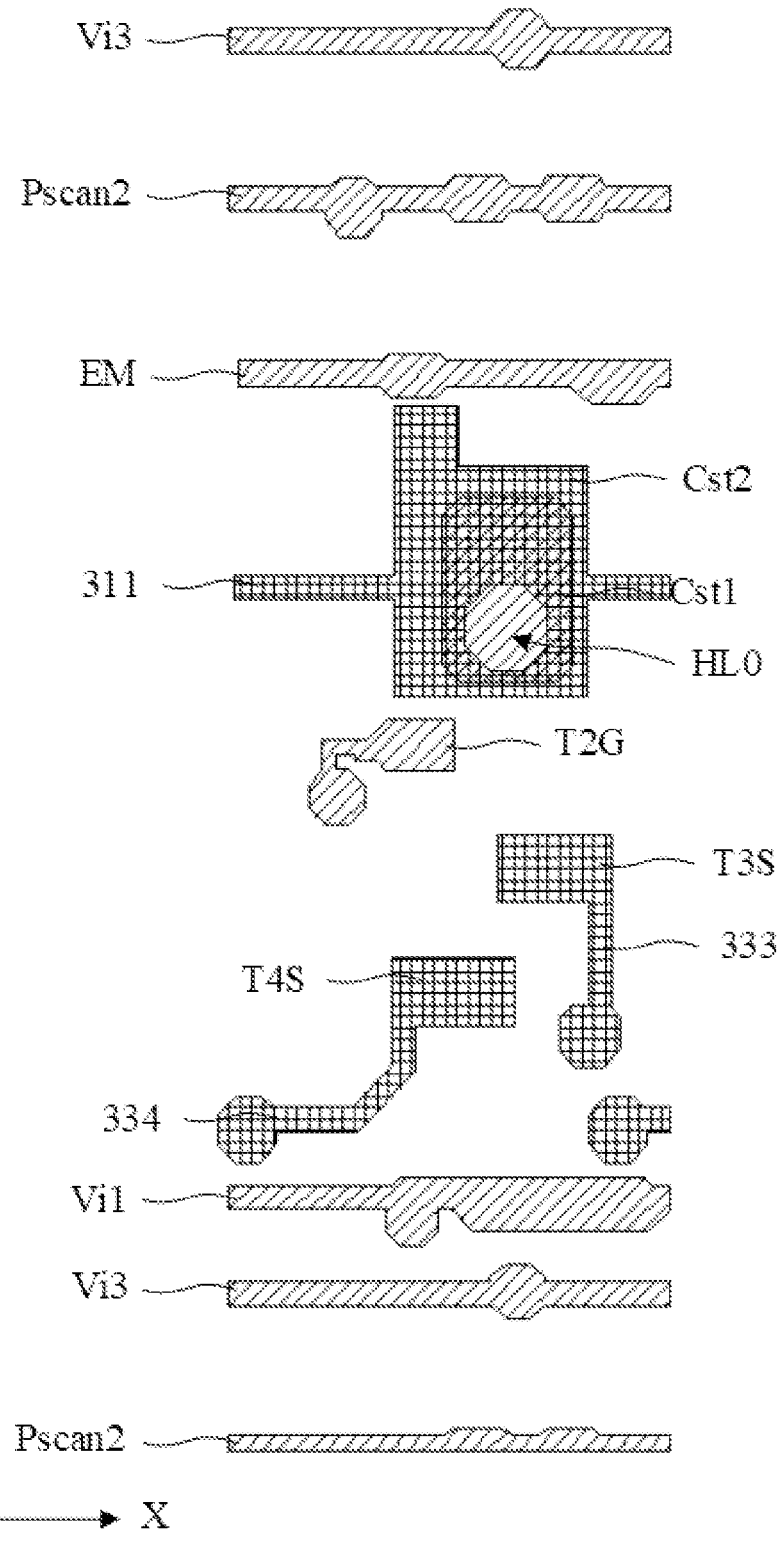
FIG. 8 is a laminated film layer diagram of the first gate layer and the second gate layer in the display panel of the present application.

Referring to FIGS. 7 and 8, the second gate layer 127 includes the fourth plate Cst2 of the storage capacitor Cst, a first shading unit T3S of the compensation transistor T3, and a second shading unit T4S of the first reset transistor T4, all arranged along the second direction Y The fourth plate Cst2, the first shading unit T3S, and the second shading unit T4S are positioned between the light-emitting signal line EM and the first reset signal line Vi1. The third plate Cst1 is positioned close to the light-emitting signal line EM, the second shading unit T4S is positioned close to the first reset signal line Vi1, and the first shading unit T3S is located between the second shading unit T4S and the fourth plate Cst2.

Referring to FIGS. 7 and 8, an area of the fourth plate Cst2 is larger than an area of the third plate Cst1, and an orthographic projection of the third plate Cst1 projected onto the fourth plate Cst2 is within the fourth plate Cst2. A first through hole HL0 is formed in the fourth plate Cst2 to expose a portion of the third plate Cst1.

Referring to FIG. 8, the first shading unit T3S, the second shading unit T4S, and the fourth plate Cst2 can be rectangular-shaped, and at least some top corners of the first shading unit T3S, the second shading unit T4S, and the fourth plate Cst2 can be chamfered.

Referring to FIG. 8, the second gate layer 127 also includes the first electrical connection segments 311 disposed on two sides of the fourth plate Cst2. Both the first electrical connection segments 311 extend along the first direction X. In two adjacent sub-pixel units 211 arranged along the first direction X, the fourth plates Cst2 of the two sub-pixel units 211 are electrically connected through the first electrical connection segment 311. In this embodiment, the fourth plate Cst2 is connected to the first high potential line VDD1. To reduce the impedance on the fourth plate Cst2, this application enables the fourth plates (Cst2) of the sub-pixel units (211) arranged along the first direction X to be interconnected and set in parallel with the first high potential line VDD1 in an upper layer, thereby reducing the impedance of the first high potential line VDD1 and the fourth plate Cst2.

Figures 9, 10:
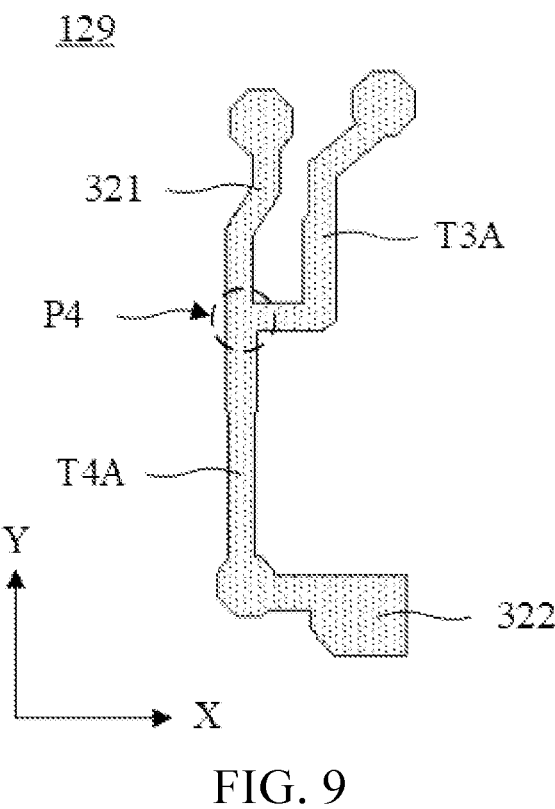
FIG. 9 is a film layer diagram of a second active layer in the display panel of the present application.
FIG. 10 is a film layer diagram of a third gate layer in the display panel of the present application.
Figure 11:
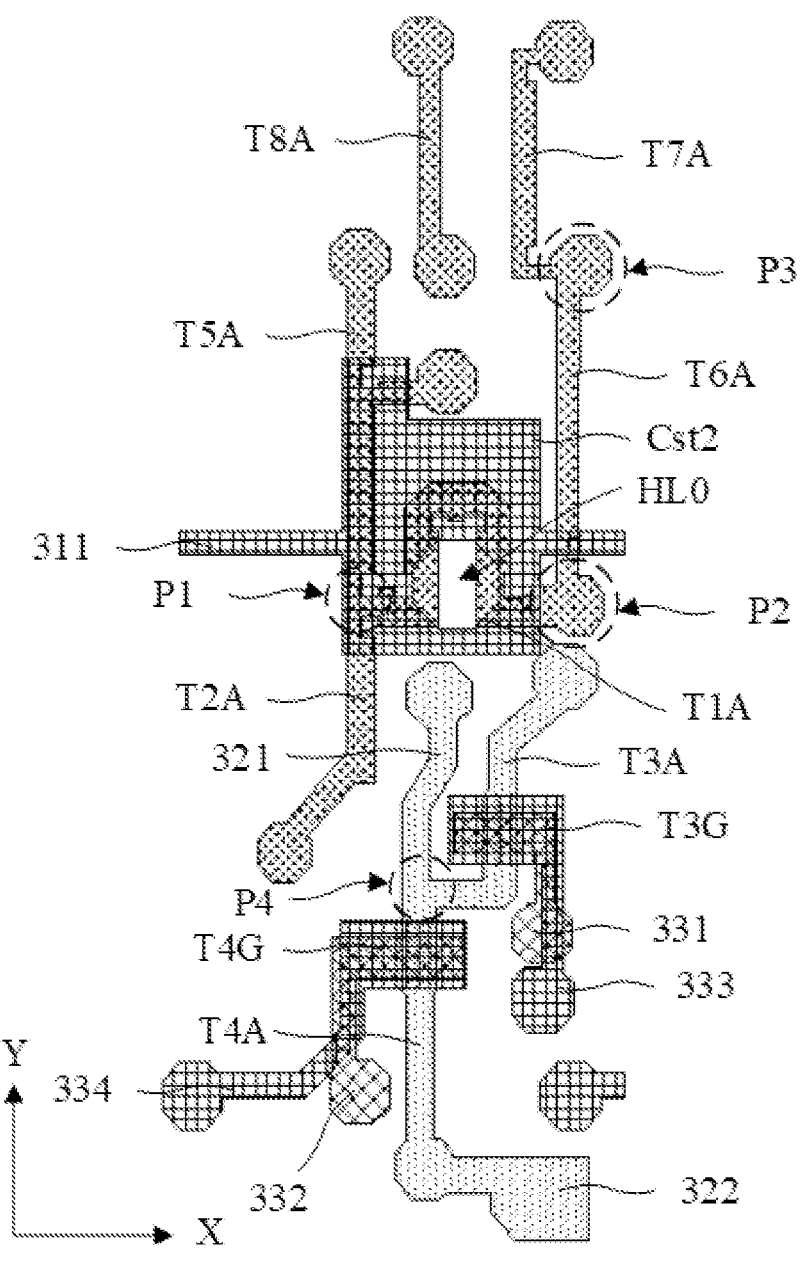
FIG. 11 is a film layer diagram of the first active layer, the second active layer, the second gate layer, and the third gate layer in the display panel of the present application.

Referring to FIGS. 9 and 11, the second active layer 129 includes a compensation active part T3A of the compensation transistor T3 and a first reset active part T4A of the first reset transistor T4. Both the compensation active part T3A and the first reset active part T4A extend along the second direction Y A first end of the compensation active part T3A and a first end of the first reset active part T4A are connected at a fourth connection point P4. A second end of the compensation active part T3A extends towards the second connection point P2 but is set apart from the second connection point P2, while a second end of the first reset active part T4A extends towards and overlaps with the first reset signal line Vi1.

In the present embodiment, the fourth connection point P4 can be the third node Q.

Referring to FIGS. 9 and 11, the second active layer 129 also includes a first extension segment 321 connected to the fourth connection point P4 and a second extension segment 322 connected to the second end of the first reset active part T4A. The first extension segment 321 extends along the second direction Y towards the storage capacitor Cst but is set apart from it. The second extension segment 322 extends along the first direction X and overlaps at least partially with the first reset signal line Vi1.

Refer to FIGS. 10 and 11, the third gate layer 131 includes the compensation gate T3G and the first reset gate T4G of the first reset transistor T4. An area of the compensation gate T3G is smaller than an area of the first shading unit T3S, and an orthographic projection of the compensation gate T3G projected on the first shading unit T3S falls within the first shading unit T3S. Similarly, an area of the first reset gate T4G is smaller than an area of the second shading unit T4S, and an orthographic projection of the first reset gate T4G projected on the second shading unit T4S falls within the second shading unit T4S.

Referring to FIGS. 10 and 11, the first reset gate T4G partially overlaps with the first reset active part T4A, and this overlapping portion serves as a channel of the first reset active part T4A. The compensation gate T3G partially overlaps with the compensation active part T3A, and this overlapping portion serves as a channel of the compensation active part T3A.

Referring to FIGS. 10 and 11, both the first reset gate T4G and the compensation gate T3G can be rectangular-shaped, and some of their top corners can be chamfered.

Referring to FIGS. 10 and 11, the third gate layer 131 also includes a first conductive segment 331 connected to the compensation gate T3G, and a second conductive segment 332 connected to the first reset gate T4G. The first conductive segment 331 extends along the second direction Y towards a side away from the compensation gate T3G, and the second conductive segment 332 also extends along the second direction Y, but towards a side away from the first reset gate T4G.

Referring to FIGS. 7 and 11, the second gate layer 127 also includes a third conductive segment 333 connected to the first shading unit T3S, and a fourth conductive segment 334 connected to the second shading unit T4S. The third conductive segment 333 extends along the second direction Y towards a side away from the compensation gate T3G. A linewidth of the first conductive segment 331 can be less than or equal to a linewidth of the third conductive segment 333, and an orthographic projection of the first conductive segment 331 projected on the third conductive segment 333 can fall within the third conductive segment 333. A fourth conductive segment 334 can initially extend along the second direction Y towards a side away from the first reset gate T4G, and then extend along the first direction X towards a side away from the compensation transistor T3. The ends of the second conductive segment 332 and the fourth conductive segment 334, which are away from the first reset gate T4G, can be positioned on a same horizontal line.

Figure 12:
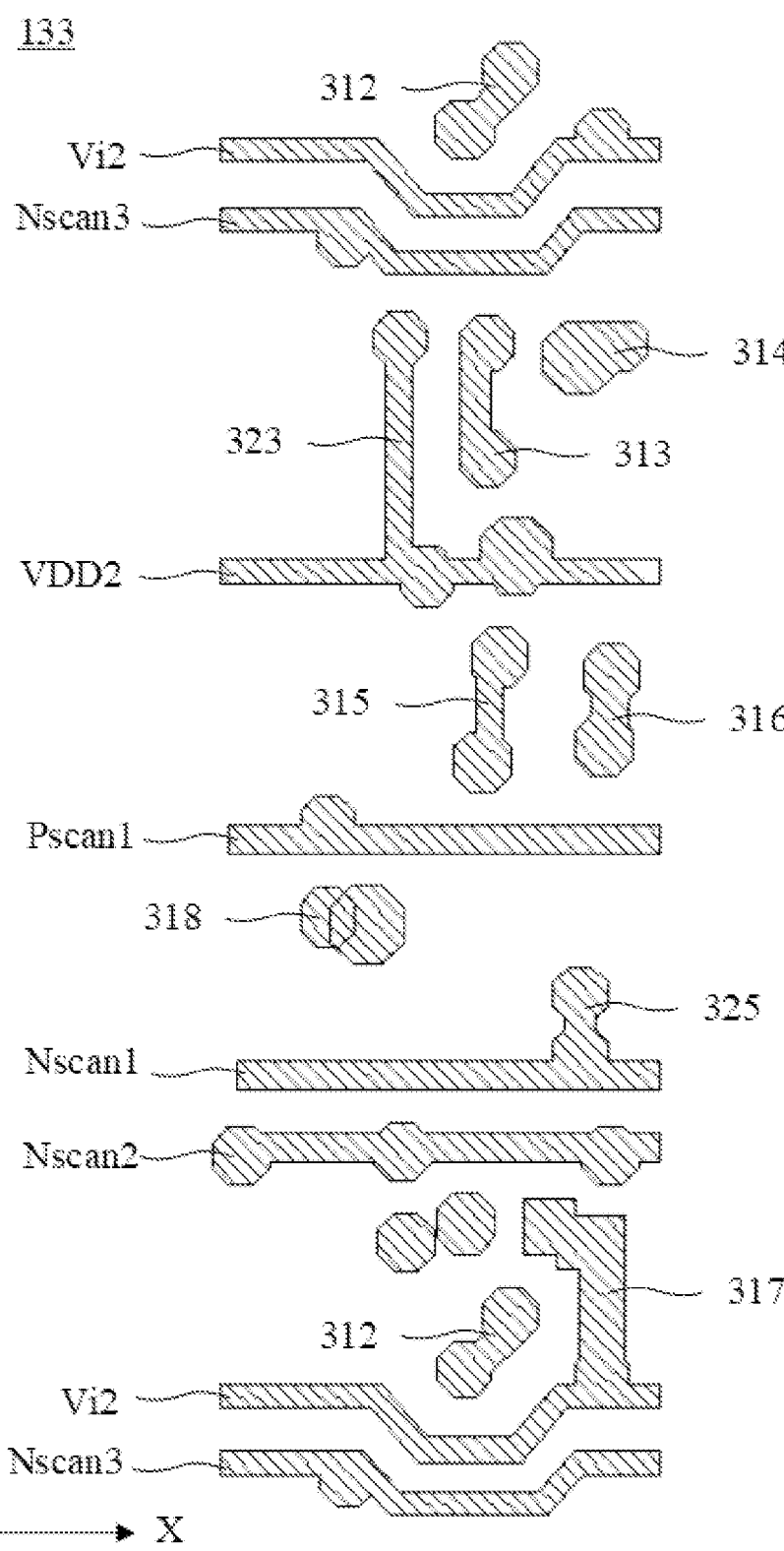
FIG. 12 is a film layer diagram of a first source-drain layer in the display panel of the present application.
Figure 13:
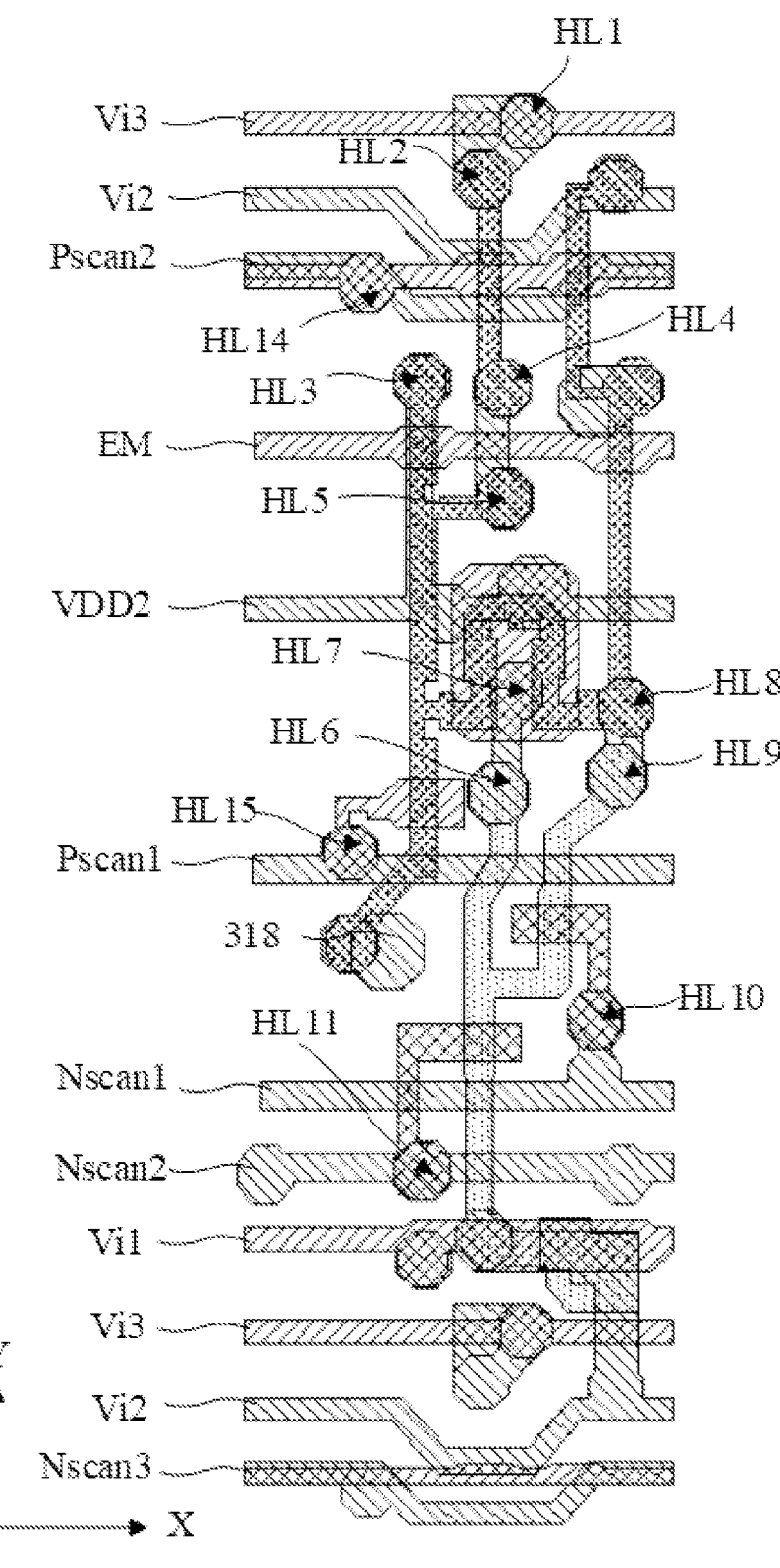
FIG. 13 is a film layer diagram of the first gate layer, the third gate layer, the first active layer, the second active layer, and the first source-drain layer in the display panel of the present application.
Figure 14:
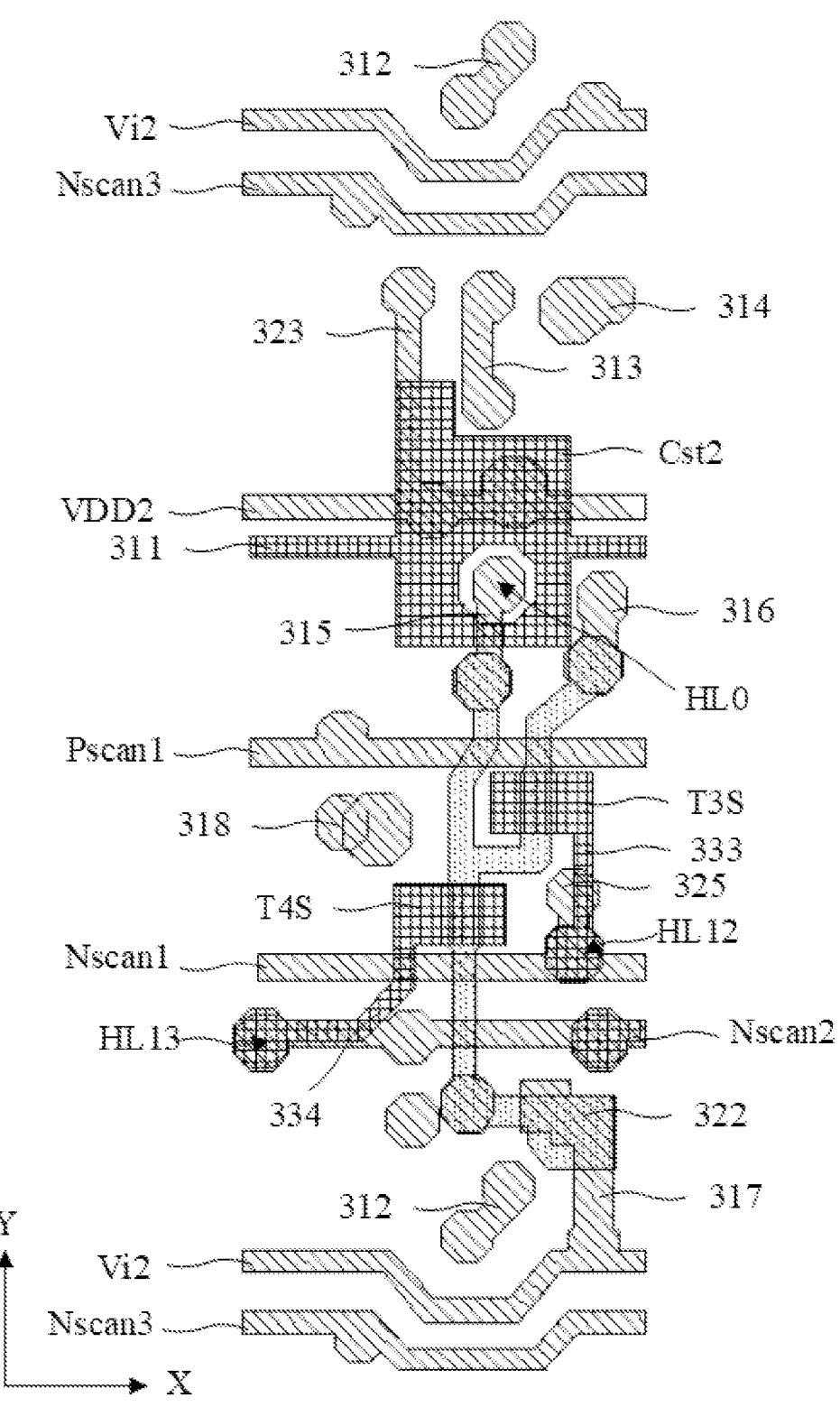
FIG. 14 is a film layer diagram of the second active layer, the second gate layer, and the first source-drain layer in the display panel of the present application.
Figure 15:
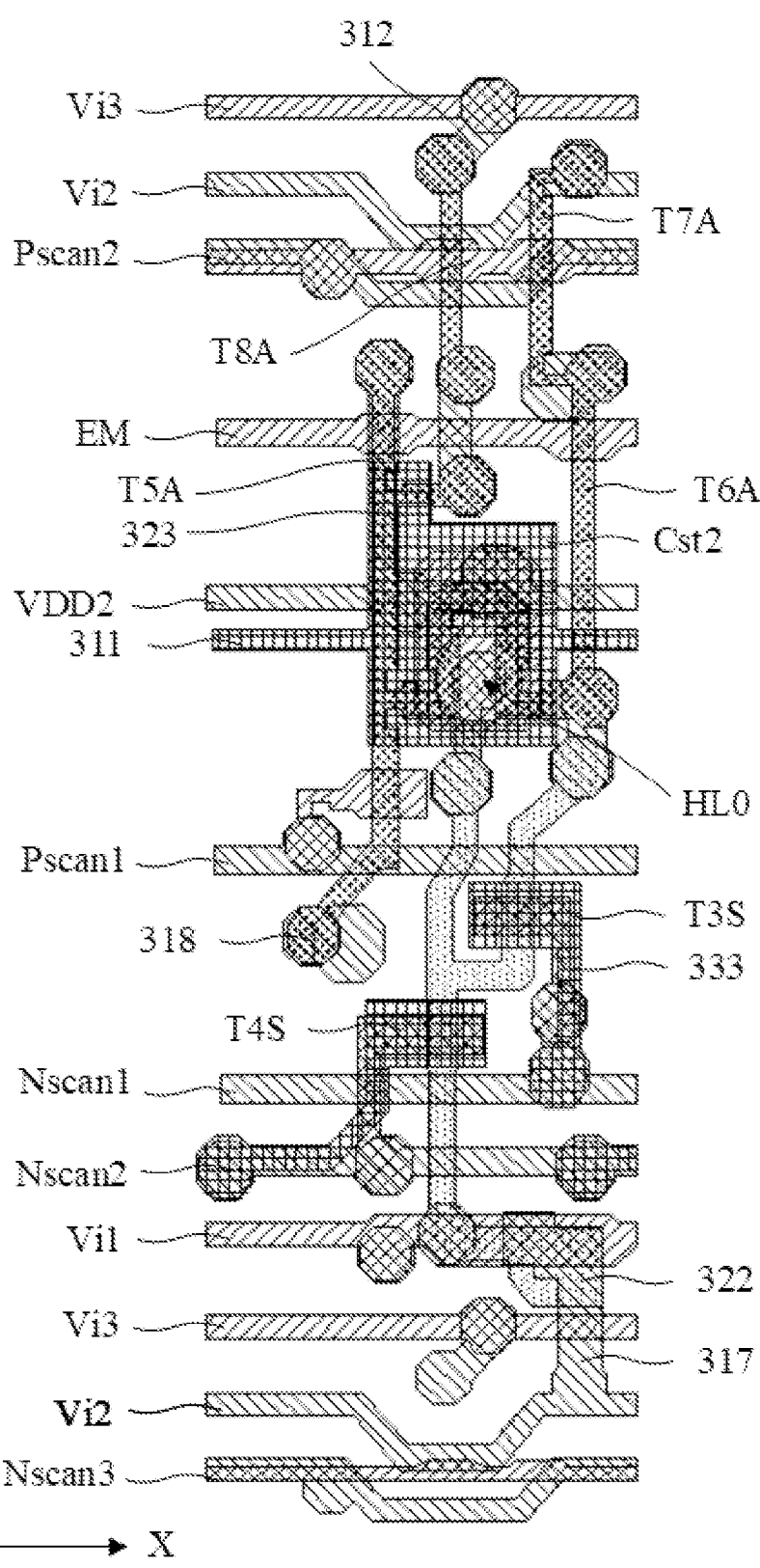
FIG. 15 is a film layer diagram of the first gate layer, the second gate layer, the third gate layer, the first active layer, the second active layer, and the first source-drain layer in the display panel of the present application.

Referring to FIG. 12, the first source-drain layer 133 includes the second reset signal line Vi2, a fifth control signal line Nscan3, a second high potential line VDD2, the second control signal line Pscan1, the first control signal line Nscan1, and the third control signal line Nscan2 arranged along the second direction Y The second reset signal line Vi2, the fifth control signal line Nscan3, the second high potential line VDD2, the second control signal line Pscan1, the first control signal line Nscan1, and the third control signal line Nscan2 can all extend along the first direction X.

Referring to FIGS. 12 to 15, the second reset signal line Vi2 is positioned between the third reset signal line Vi3 and the first control signal line Nscan1. The fifth control signal line Nscan3 partially overlaps with the fourth control signal line Pscan2. The second high potential line VDD2 is located between the light-emitting signal line EM and the first electrical connection segment 311. The second control signal line Pscan1, the first control signal line Nscan1, and the third control signal line Nscan2 are placed between the first electrical connection segment 311 and the first reset signal line Vi1. Furthermore, the second control signal line Pscan1 is positioned close to the first electrical connection segment 311, the third control signal line Nscan2 is close to the first reset signal line Vi1, and the first control signal line Nscan1 is situated between the second control signal line Pscan1 and the third control signal line Nscan2.

Referring to FIGS. 12 to 15, the first source-drain layer 133 further includes a second electrical connection segment 312 set between the second reset signal line Vi2 and the third reset signal line Vi3. A first end of the second electrical connection segment 312 is electrically connected to the third reset signal line Vi3 through a first via hole HL1, and a second end of the second electrical connection segment 312 is electrically connected to a first end of the third reset active part T8A through a second via hole HL2. The third reset signal line Vi3 transmits a reference voltage to the third reset transistor T8 via the second electrical connection segment 312.

In the present embodiment, the first via hole HL1 penetrates the second gate insulating layer 126, the third gate insulating layer 128, the fourth gate insulating layer 130, and the first interlayer insulating layer 132. The second via hole HL2 penetrates the first gate insulating layer 124, the second gate insulating layer 126, the third gate insulating layer 128, the fourth gate insulating layer 130, and the first interlayer insulating layer 132.

To avoid interference between the second electrical connection segment 312 and the second reset signal line Vi2, a recessed design is employed for the second reset signal line Vi2 at a position of the second reset signal line Vi2 corresponding to the second electrical connection segment 312, meaning that the signal line in this area is offset towards a side away from the third reset signal line Vi3. At the same time, to ensure the spacing between the fifth control signal line Nscan3 and the second reset signal line Vi2, the fifth control signal line Nscan3 also employs a recessed design.

Referring to FIGS. 12 to 15, the first source-drain layer 133 also includes a third extension segment 323, a third electrical connection segment 313, and a fourth electrical connection segment 314, set between the second high potential line VDD2 and the fifth control signal line Nscan3. Both the third extension segment 323 and the third electrical connection segment 313 extend along the second direction Y, while the fourth electrical connection segment 314 extends along the first direction X.

In this embodiment, a first end of the third extension segment 323 is electrically connected to the second high potential line VDD2, and a second end of the third extension segment 323 extends away from the second high potential line VDD2. Additionally, the third extension segment 323 partially overlaps with the first light-emitting active part T5A, and the second end of the third extension segment 323 is electrically connected to a second end of the first light-emitting active part T5A through a third via hole HL3. The first end of the third electrical connection segment 313 is electrically connected to a second end of the third reset active part T8A through a fourth via hole HL4. The first active layer 123 also includes a fourth extension segment 324 connected to the first light-emitting active part T5A, with the fourth extension segment 324 extending along the first direction X. A second end of the third electrical connection segment 313 is electrically connected to the fourth extension segment 324 through a fifth via hole HL5. The third reset signal line Vi3 transmits the reference voltage to the first connection point P1 via the second electrical connection segment 312, the third electrical connection segment 313, and the fourth extension segment 324, thereby resetting the voltage at the first node A. One end of the fourth electrical connection segment 314 is electrically connected to the third connection point P3 in the first active layer 123 through a via, and another end of the fourth electrical connection segment 314 is electrically connected to a conductive layer in the second source-drain layer 135 through another via.

In the present embodiment, the third via hole HL3 penetrates the first gate insulating layer 124, the second gate insulating layer 126, the third gate insulating layer 128, the fourth gate insulating layer 130, and the first interlayer insulating layer 132. Both the fourth via hole HL4 and the fifth via hole HL5 penetrate the first gate insulating layer 124, the second gate insulating layer 126, the third gate insulating layer 128, the fourth gate insulating layer 130, and the first interlayer insulating layer 132.

Referring to FIGS. 12 to 15, the first source-drain layer 133 further includes a fifth electrical connection segment 315 and a sixth electrical connection segment 316 set between the second high potential line VDD2 and the second control signal line Pscan1. Both the fifth electrical connection segment 315 and the sixth electrical connection segment 316 extend along the second direction Y.

In this embodiment, a first end of the fifth electrical connection segment 315 passes through a sixth via hole HL6 and is electrically connected to an end of the first extension segment 321 that is away from the second control signal line Pscan1. A second end of the fifth electrical connection segment 315 extends into the storage capacitor Cst and is electrically connected to the third plate Cst1 of the storage capacitor Cst through a seventh via hole HL7. In the structure shown in FIG. 14, the seventh via hole HL7 passes through the first through hole HL0 in the fourth plate Cst2. A center of the first through hole HL0 and a center of the seventh via hole HL7 can be located on a same line perpendicular to a light-emitting surface of the display panel 100. A first end of the sixth electrical connection segment 316 passes through an eighth via hole HL8 to be electrically connected to the second connection point P2 in the first active layer 123. A second end of the sixth electrical connection segment 316 passes through a ninth via hole HL9 to be electrically connected to the second end of the compensation active part T3A.

In the present embodiment, the sixth via hole HL6 and the ninth via hole HL9 penetrate through the fourth gate insulating layer 130 and the first interlayer insulating layer 132. The seventh via hole HL7 and the eighth via hole HL8 penetrate through the first gate insulating layer 124, the second gate insulating layer 126, the third gate insulating layer 128, the fourth gate insulating layer 130, and the first interlayer insulating layer 132.

Referring to FIGS. 12 to 15, the first source-drain layer 133 further includes a fifth extension segment 325. One end of the fifth extension segment 325 is electrically connected to the first control signal line Nscan1, and the fifth extension segment 325 extends along the second direction Y towards a side away from the first control signal line Nscan1. An end of the fifth extension segment 325, which is away from the first control signal line Nscan1, is electrically connected to the first conductive segment 331 through a tenth via hole HL10. The first control signal line Nscan1 transmits control signals to the compensation gate T3G of the compensation transistor T3 through the fifth extension segment 325 and the first conductive segment 331. At the same time, an end of the second conductive segment 332, which is away from the first reset gate T4G, overlaps with the third control signal line Nscan2 and is electrically connected to the third control signal line Nscan2 through an eleventh via hole HL11. The third control signal line Nscan2 transmits control signals to the first reset gate T4G of the first reset transistor T4 through the second conductive segment 332.

In the present embodiment, both the tenth via hole HL10 and the eleventh via hole HL11 penetrate the first interlayer insulating layer 132.

Referring to FIGS. 12 to 15, the third conductive segment 333 overlaps with both the first conductive segment 331 and the fifth extension segment 325, and is electrically connected to the first control signal line Nscan1 through a twelfth via hole HL12. The first control signal line Nscan1 transmits the control signal to the first shading unit T3S via the third conductive segment 333. Hence, the first shading unit T3S can be repurposed as a bottom gate of the compensation transistor T3, while the compensation gate T3G serves as a top gate of the compensation transistor T3. The configuration of the first shading unit T3S and the compensation gate T3G can enhance the conductivity rate of the compensation transistor T3, improving the device performance of the compensation transistor T3. The fourth conductive segment 334 overlaps with a portion of the third control signal line Nscan2 and is electrically connected to the third control signal line Nscan2 through a thirteenth via hole HL13. The third control signal line Nscan2 transmits the control signal to the second shading unit T4S via the fourth conductive segment 334. Therefore, the second shading unit T4S can be repurposed as a bottom gate of the first reset transistor T4, with the first reset gate T4G serving as a top gate of the first reset transistor T4. The configuration of the second shading unit T4S and the first reset gate T4G can enhance the conductivity rate of the first reset transistor T4, improving the device performance of the first reset transistor T4.

In the present embodiment, both the twelfth via hole HL12 and the thirteenth via hole HL13 penetrate the third gate insulating layer 128, the fourth gate insulating layer 130, and the first interlayer insulating layer 132.

It should be noted that the third conductive segment 333 can be electrically insulated from the first control signal line Nscan1, and the fourth conductive segment 334 can be electrically insulated from the third control signal line Nscan2.

Referring to FIGS. 12 to 15, the fifth control signal line Nscan3 can pass through a fourteenth via hole HL14 to be connected in parallel with the fourth control signal line Pscan2. This means that the fifth control signal line Nscan3 and the fourth control signal line Pscan2 are configured in parallel, reducing the impedance of both the fifth control signal line Nscan3 and the fourth control signal line Pscan2.

In this embodiment, the fourteenth via hole HL14 penetrates the second gate insulating layer 126, the third gate insulating layer 128, the fourth gate insulating layer 130, and the first interlayer insulating layer 132.

Refer to FIGS. 12 to 15, where the first control signal line Nscan1 partially overlaps with the first reset active part T4A, the second control signal line Pscan1 partially overlaps with the first extension segment 321, and the second control signal line Pscan1 partially overlaps with the compensation active part T3A. The third control signal line Nscan2 also partially overlaps with the first reset active part T4A. These four overlapping regions involve the material of the second active layer 129 overlapping with the material of the first source-drain layer 133. Between the first source-drain layer 133 and the second active layer 129, the fourth gate insulating layer 130 and the first interlayer insulating layer 131 are disposed, without the material of the third gate layer 131 being set in between. This arrangement avoids the technical issue of potential short-circuiting between the third gate layer 131 and the first source-drain layer 133.

Referring to FIGS. 12 to 15, the overlap between the second control signal line Pscan1 and the first extension segment 321 forms the boost capacitor Cboost in this application. The fifth plate of the boost capacitor Cboost can be the part of the first extension segment 321 that overlaps with the second control signal line Pscan1, and the sixth plate of the boost capacitor Cboost can be the part of the second control signal line Pscan1 that overlaps with the first extension segment 321.

Referring to FIGS. 12 to 15, the first source-drain layer 133 also includes a seventh electrical connection segment 317 disposed between the second reset signal line Vi2 and the third control signal line Nscan2. The seventh electrical connection segment 317 extends along the second direction Y, and towards a side away from the second reset signal line Vi2. The seventh electrical connection segment 317 overlaps with the second extension segment 322. This setup effectively forms a capacitor between the first reset signal line Vi1 and the second reset signal line Vi2, ensuring the stability of the voltage on the first reset signal line Vi1 and the second reset signal line Vi2.

Figure 16:
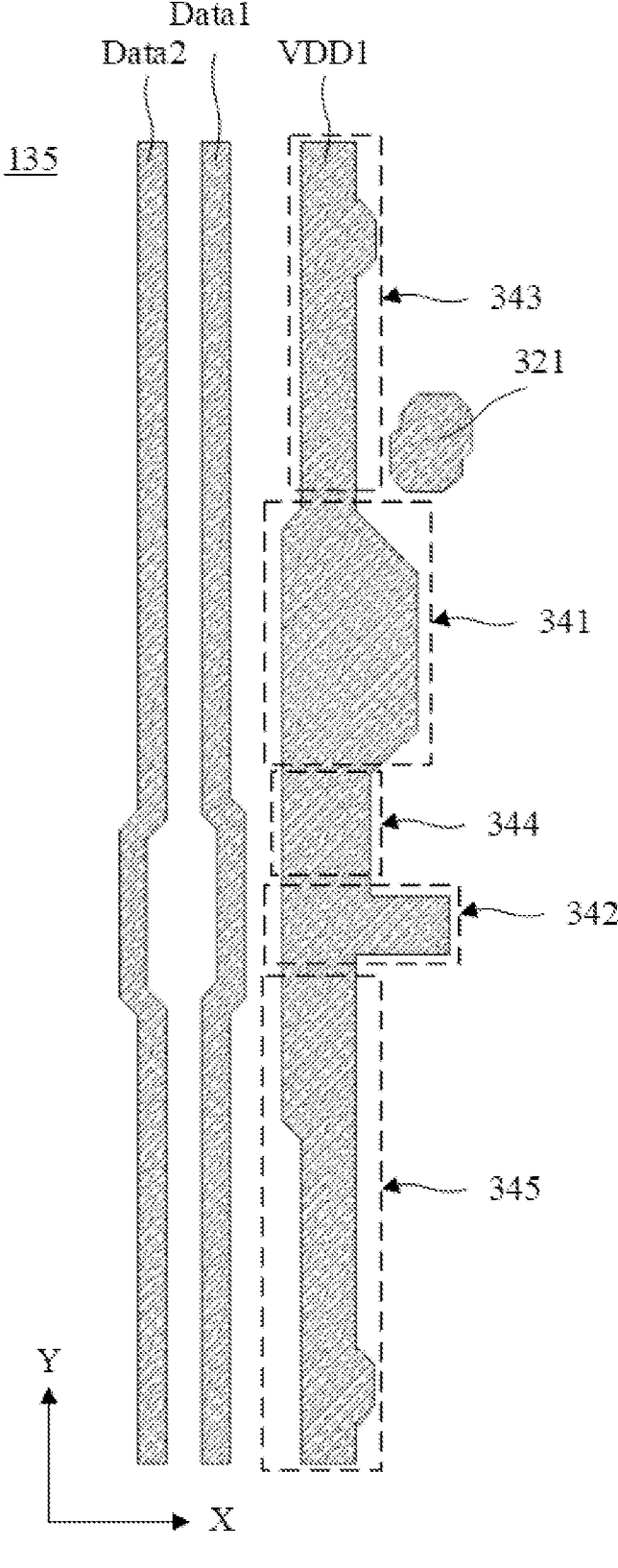
FIG. 16 is a first type of film layer diagram of a second source-drain layer in the display panel of the present application.

Referring to FIG. 16, the second source-drain layer 135 includes the first data signal line Data1, the second data signal line Data2, and the first high potential line VDD1. The second data signal line Data2, the first data signal line Data1, and the first high potential line VDD1 are arranged along the first direction X and extend along the second direction Y The first data signal line Data1 is positioned between the second data signal line Data2 and the first high potential line VDD1.

Figure 17:
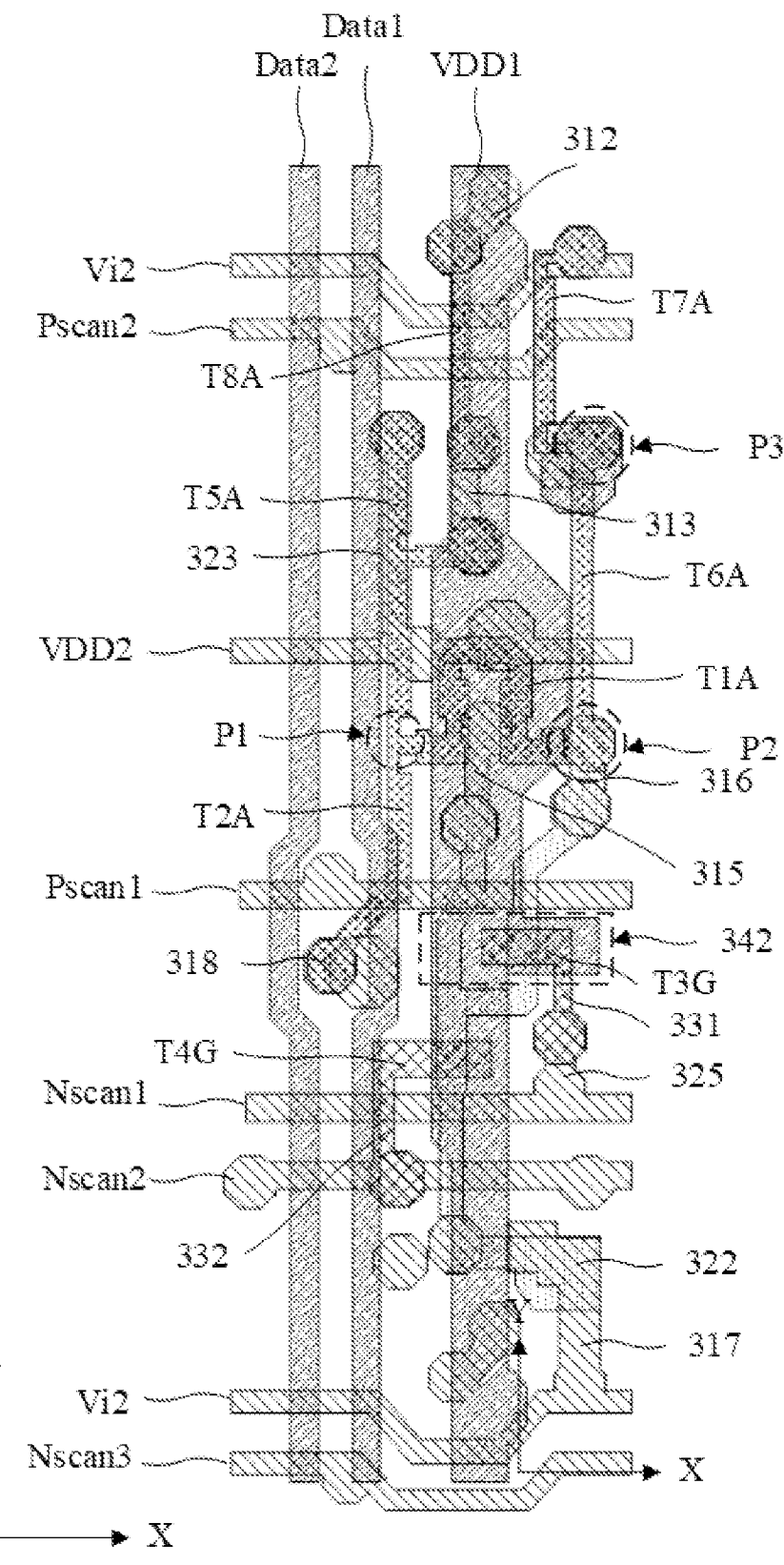
FIG. 17 is a first type of laminated film layer diagram of the first active layer, the second active layer, the third gate layer, the first source-drain layer, and the second source-drain layer in the display panel of the present application.
Figure 18:
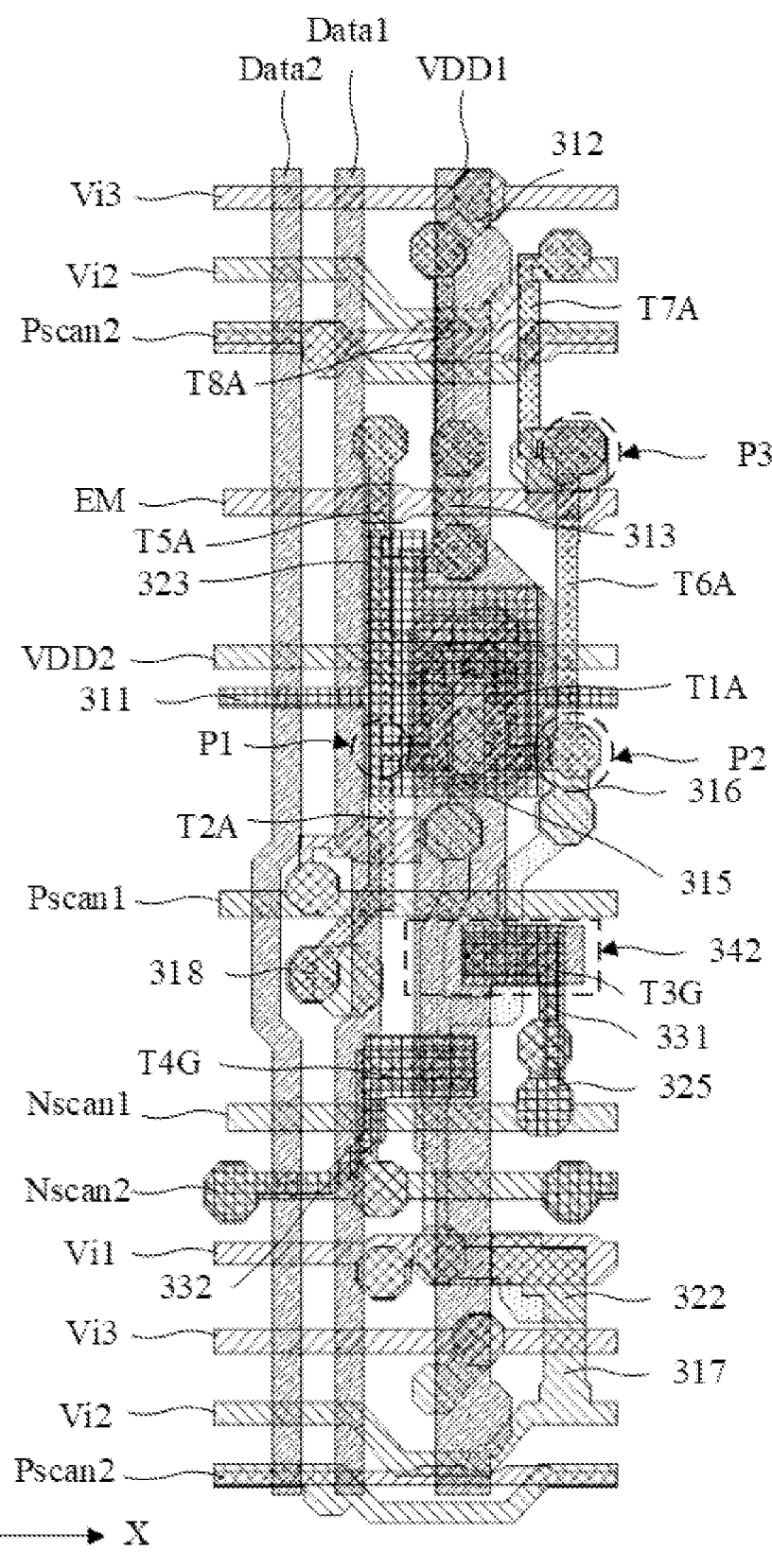
FIG. 18 is a first type of laminated film layer diagram of the pixel driving circuit in the present application.
Figure 19:
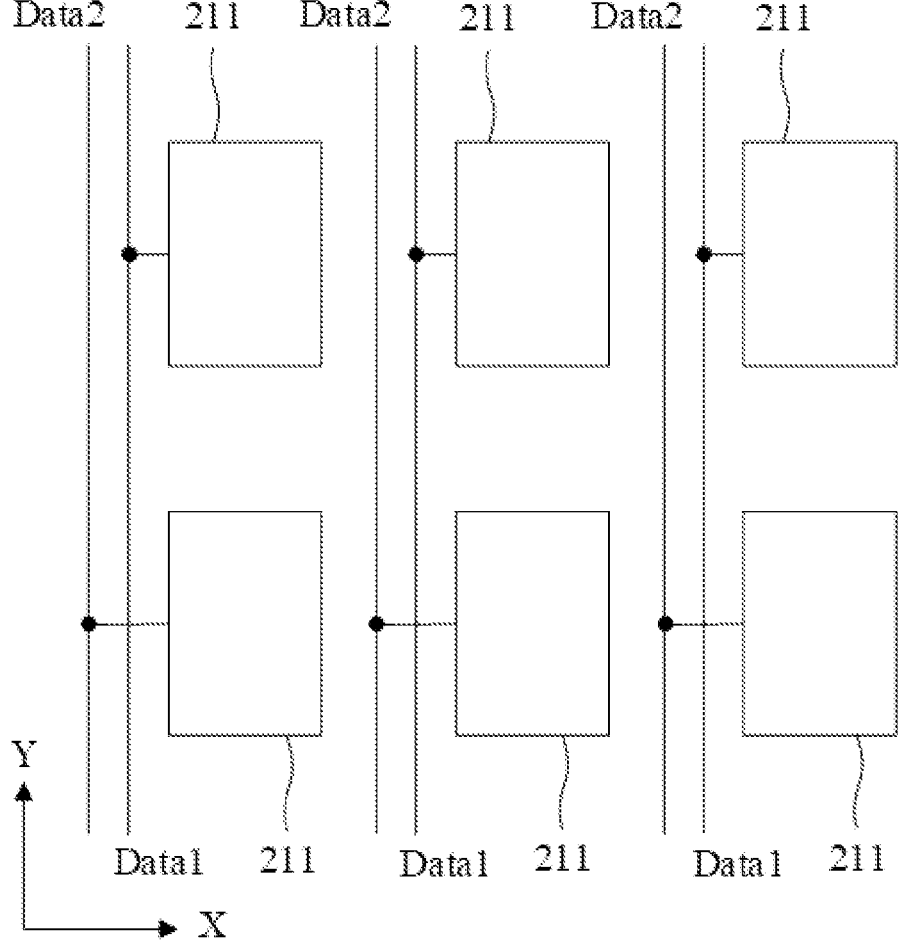
FIG. 19 is a connection diagram of different sub-pixel units and different data lines in the display panel of the present application.

Referring to FIGS. 17 to 19, the first source-drain layer 133 includes an eighth electrical connection segment 318 disposed between the first control signal line Nscan1 and the second control signal line Pscan1. One end of the eighth electrical connection segment 318 is electrically connected to a second end of the switch active part T2A, and another end of the eighth electrical connection segment 318 is electrically connected to the first data signal line Data1. The first data signal line Data1 transmits data signals to the switch transistor T2 through the eighth electrical connection segment 318.

In the structure shown in FIG. 19, this application lists 6 sub-pixel units 211 as an example. The sub-pixel units 211 located in the first row are all connected to the first data signal line Data1, while the sub-pixel units 211 located in the second row are all connected to the second data signal line Data2. The sub-pixel units 211 listed in FIGS. 17 and 18 correspond to the sub-pixel units 211 in the first row of FIG. 19.

In the present embodiment, the structure of each pixel driving circuit 211a is identical, meaning that input ends of the switch active parts T2A of the switch transistors T2 are all positioned on the same side. If the first data signal line Data1 and the second data signal line Data2 are positioned on opposite sides of the pixel driving circuit 211a, for example, with the first data signal line Data1 on the left side of pixel driving circuit 211a and the second data signal line Data2 on the right side, then the input ends of the switch active parts T2A for the sub-pixel units 211 in the first row are positioned adjacent to the first data signal line Data1.

Meanwhile, a distance between the switch active part T2A of the sub-pixel unit 211 in the second row and the second data signal line Data2 equals a width of the sub-pixel unit 211. This configuration necessitates a connection line that spans the width of the sub-pixel unit 211 to electrically connect the second data signal line Data2 with the switch active part T2A of the sub-pixel unit 211 in the second row. This connection line overlaps with multiple components within the pixel driving circuit 211a, increasing coupling capacitance and thereby degrading the stability of the pixel driving circuit 211a. In the structure shown in FIG. 19, by positioning both data signal lines on the same side of the pixel driving circuit 211a, the application reduces the connection distance between the data signal lines and the switch active parts T2A of the sub-pixel units 211, thereby minimizing internal coupling capacitance of the pixel driving circuit 211a and enhancing the stability of the pixel driving circuit 211a.

Referring to FIGS. 16 to 18, the first high potential line VDD1 includes a first sub-plate 341, a second sub-plate 342, a third sub-plate 343, a fourth sub-plate 344, and a fifth sub-plate 345. The third sub-plate 343, the first sub-plate 341, the fourth sub-plate 344, the second sub-plate 342, and the fifth sub-plate 345 are arranged along the second direction Y The first sub-plate 341 is positioned between the third sub-plate 343 and the fourth sub-plate 344, while the second sub-plate 342 is located between the fourth sub-plate 344 and the fifth sub-plate 345. Along the first direction X, a width of the first sub-plate 341 is less than a width of the second sub-plate 342, the width of the first sub-plate 341 can be greater than a width of the fourth sub-plate 344, and the width of the fourth sub-plate 344 can be greater than or equal to widths of the third sub-plate 343 and the fifth sub-plate 345.

In this embodiment, since a potential of the drive gate T1G corresponds to a potential of the third node Q, and changes in the potential of the third node Q directly impact a working current of the light-emitting device 211b, it's crucial to ensure the stability of the potential of the third node Q. To achieve this, the present application can ensure that an orthographic projection of the drive gate T1G projected on the first high potential line VDD1 falls within the first sub-plate 341. This effectively utilizes the first sub-plate 341 as a shielding layer to maintain the stability of the potential of the third node Q. Therefore, it's necessary to increase the lateral width of the first sub-plate 341 so that the first sub-plate 341 entirely covers the drive gate T1G. The third plate Cst1 of the storage capacitor Cst, repurposed as the drive gate T1G, also has its orthographic projection projected on the first high potential line VDD1 located within the first sub-plate 341. Consequently, the width of the first sub-plate 341 in this application can be greater than the widths of the third sub-plate 343, the fourth sub-plate 344, and the fifth sub-plate 345.

In the present embodiment, since both the fifth electrical connection segment 315 and the first extension segment 321 are electrically connected to the drive gate T1G, variations in the potential on the fifth electrical connection segment 315 and the first extension segment 321 can also affect the potential of the drive gate T1G. To address this, this application increases the width of the fourth sub-plate 344 to fully cover both the fifth electrical connection segment 315 and the first extension segment 321. Therefore, the lateral width of the fourth sub-plate 344 in this application can be made greater than the lateral widths of both the third sub-plate 343 and the fifth sub-plate 345.

Refer to FIGS. 16 and 17, where the compensation gate T3G acts as a first subpart of the first plate. An orthographic projection of the compensation gate T3G projected on the first high potential line VDD1 located within the second sub-plate 342. The second sub-plate 342 can serve as the second plate for the first capacitor C1.

The present application achieves an arrangement where a portion of the first high potential line VDD1 overlaps with the compensation gate T3G, utilizing the compensation gate T3G as the first plate and the second sub-plate 342 as the second plate, thereby forming the first capacitor C1. The constant high potential on the second plate enhances the anti-coupling capability of the first control signal line Nscan1, thereby improving the stability of the control signal transmitted by the first control signal line Nscan1. This prevents abnormal activation of the compensation transistor T3, ensures the stability of the gate potential of the driving transistor T1, and addresses technical issues related to display anomalies in display panel 100.

It should be noted that because the second sub-plate 342 needs to fully cover both the compensation gate T3G and a portion of the first extension segment 321, the lateral width of the second sub-plate 342 in this application is greater than the lateral width of the first sub-plate 341.

Figure 20:
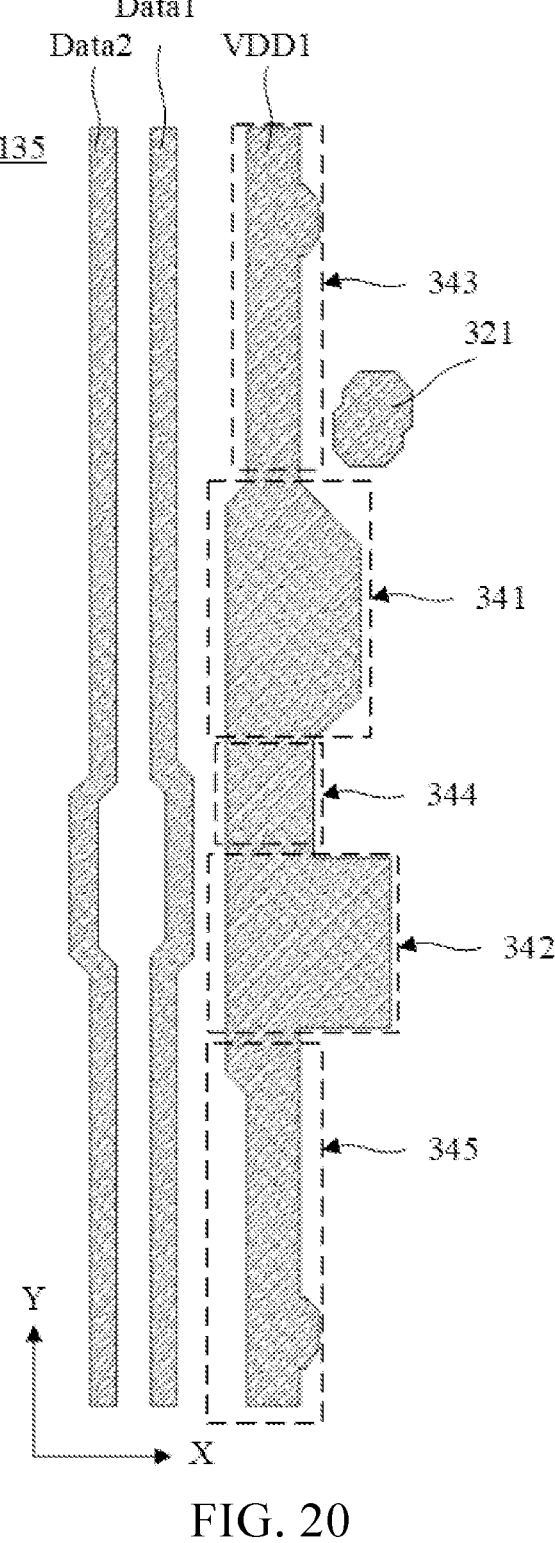
FIG. 20 is a second type of film layer diagram of the second source-drain layer in the display panel of the present application.
Figure 21:
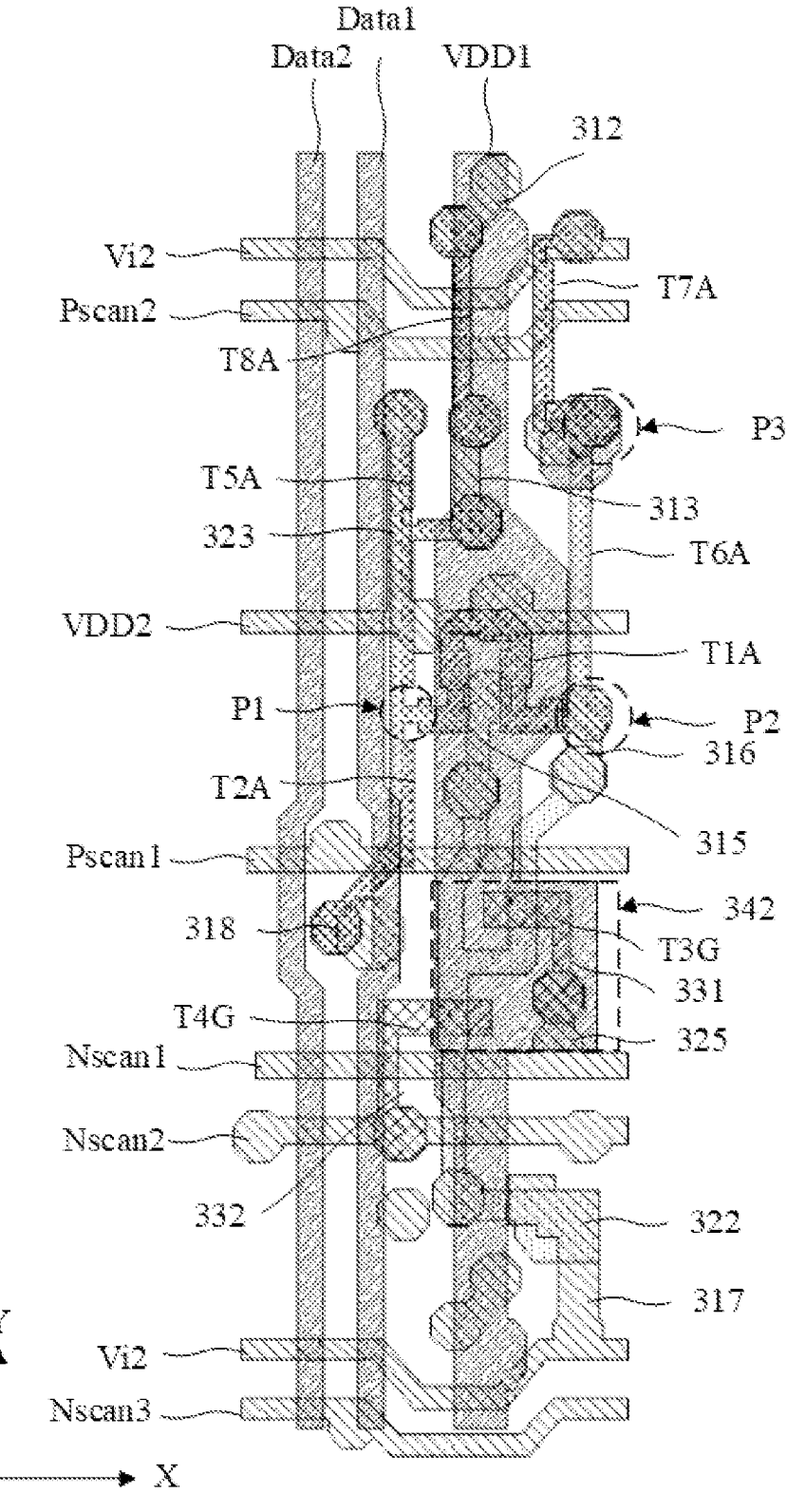
FIG. 21 is a second type of laminated film layer diagram of the first active layer, the second active layer, the third gate layer, the first source-drain layer, and the second source-drain layer in the display panel of the present application.
Figure 22:
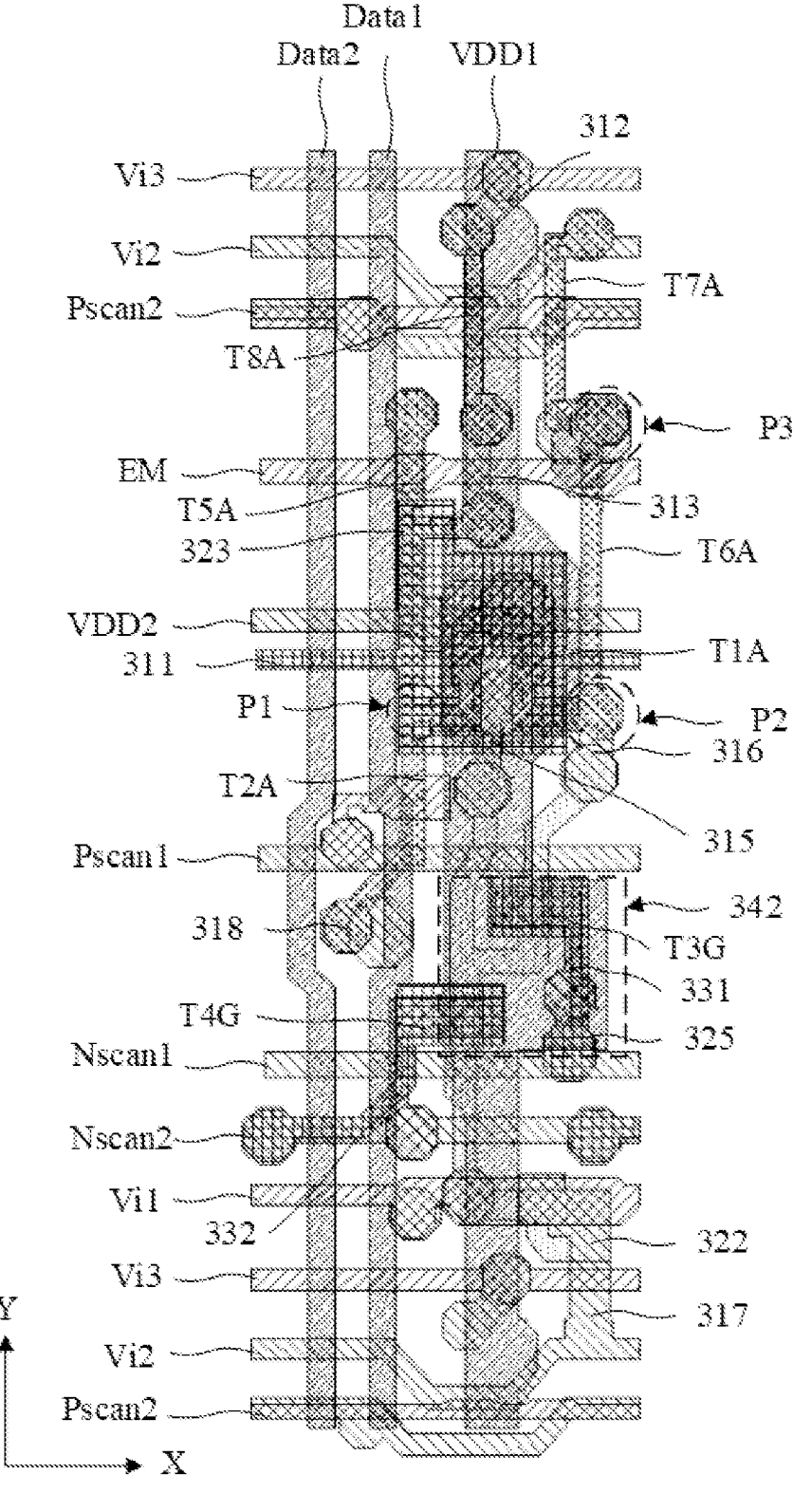
FIG. 22 is a second type of laminated film layer diagram of the pixel driving circuit in the present application.

Refer to FIGS. 20 to 22, in comparison with the structures shown in FIGS. 16 and 17, a longitudinal width of the second sub-plate 342 is increased in this application. An orthographic projection of the first conductive segment 331 on the first high potential line VDD1 can be located within the second sub-plate 342. That is, the first conductive segment 331 can act as a second subpart of the first plate, where an orthographic projection of the second subpart projected on the second source-drain layer 135 falls within the first high potential line VDD1.

By increasing the longitudinal width of the second sub-plate 342, this application ensures that the second sub-plate 342 covers both the compensation gate T3G and the first conductive segment 331 simultaneously. With the compensation gate T3G and the first conductive segment 331 acting as the first plate, and the second sub-plate 342 acting as the second plate, the first plate and the second plate form the first capacitor C1. The increase in the relative area between the first plate and the second plate boosts the capacitance value of the first capacitor C1, thereby enhancing the stability of the control signal transmitted by the first control signal line Nscan1. This prevents abnormal activation of the compensation transistor T3, ensures the stability of the gate potential of the driving transistor T1, and addresses technical issues related to display anomalies in display panel 100.

Figure 23:
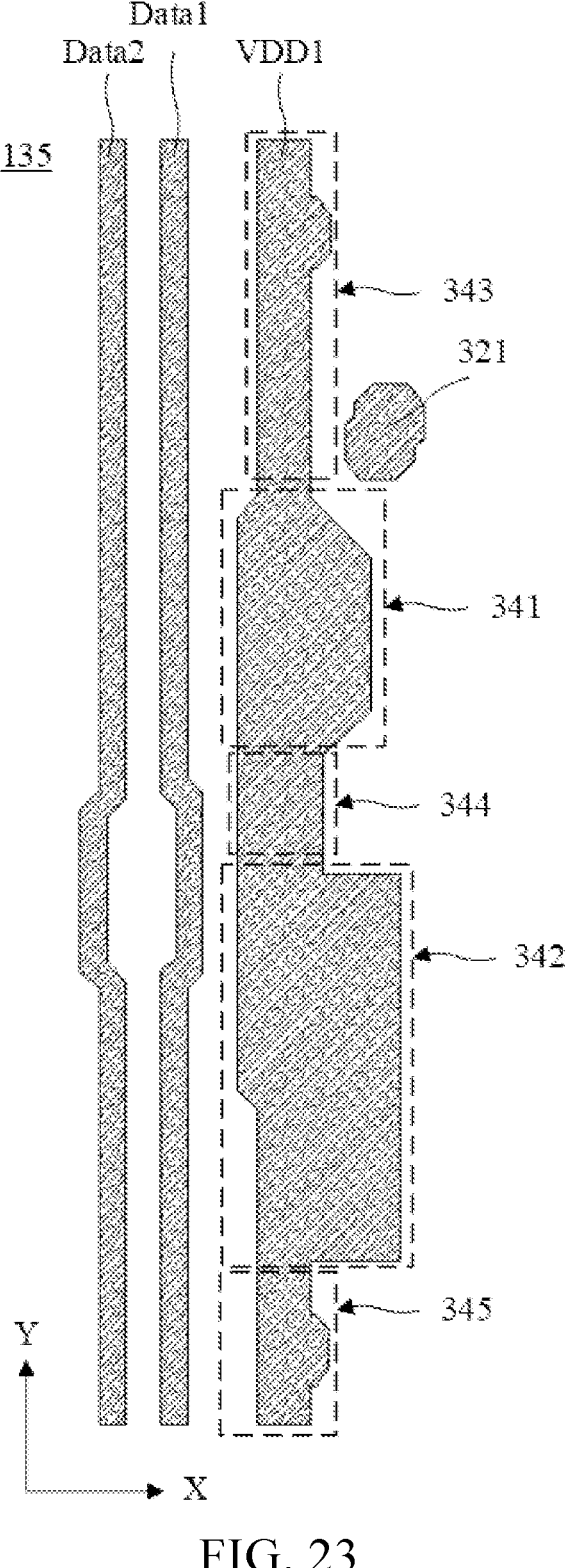
FIG. 23 is a third type of film layer diagram of the second source-drain layer in the display panel of the present application.
Figure 24:
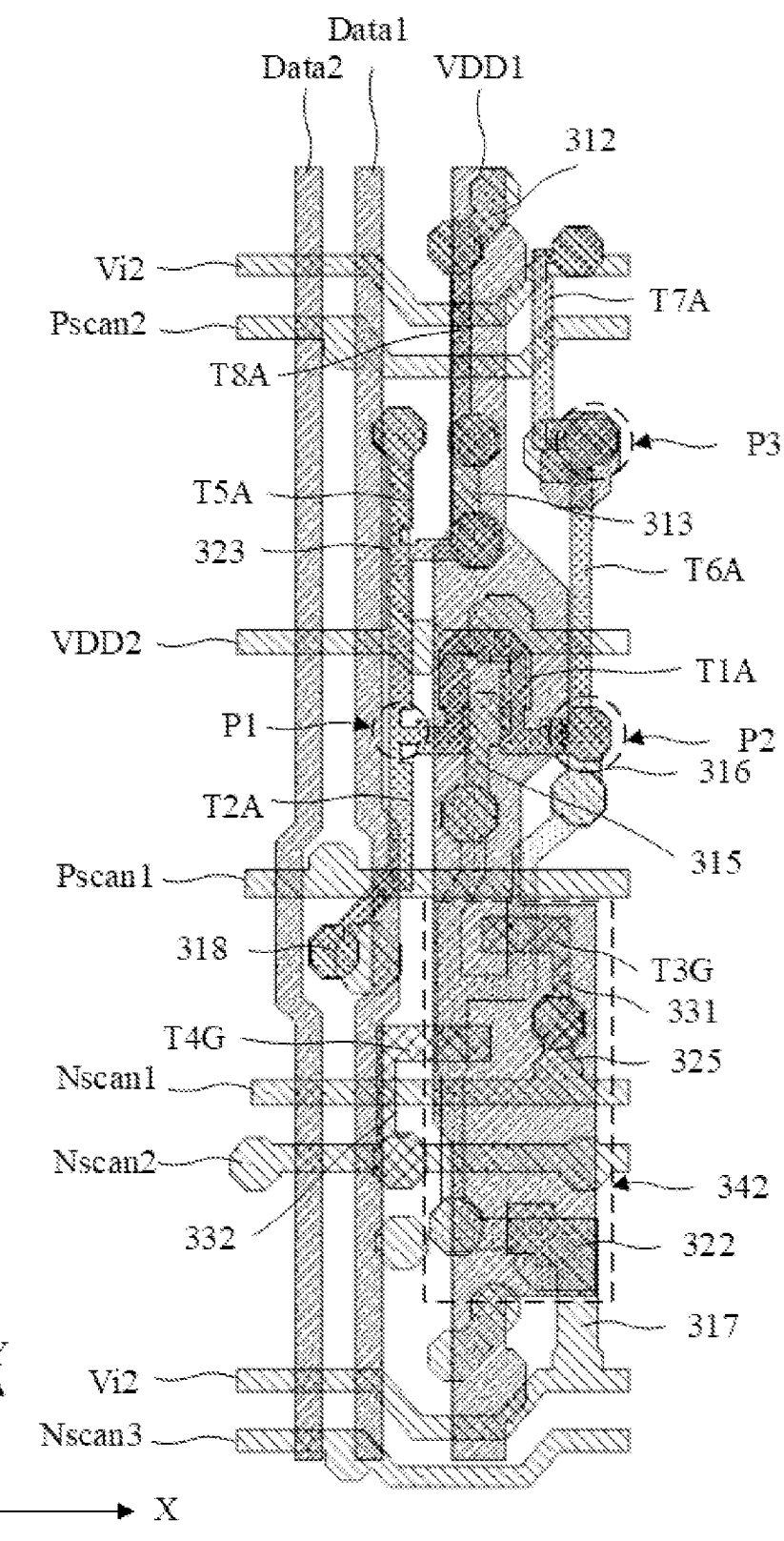
FIG. 24 is a third type of laminated film layer diagram of the first active layer, the second active layer, the third gate layer, the first source-drain layer, and the second source-drain layer in the display panel of the present application.
Figure 25:
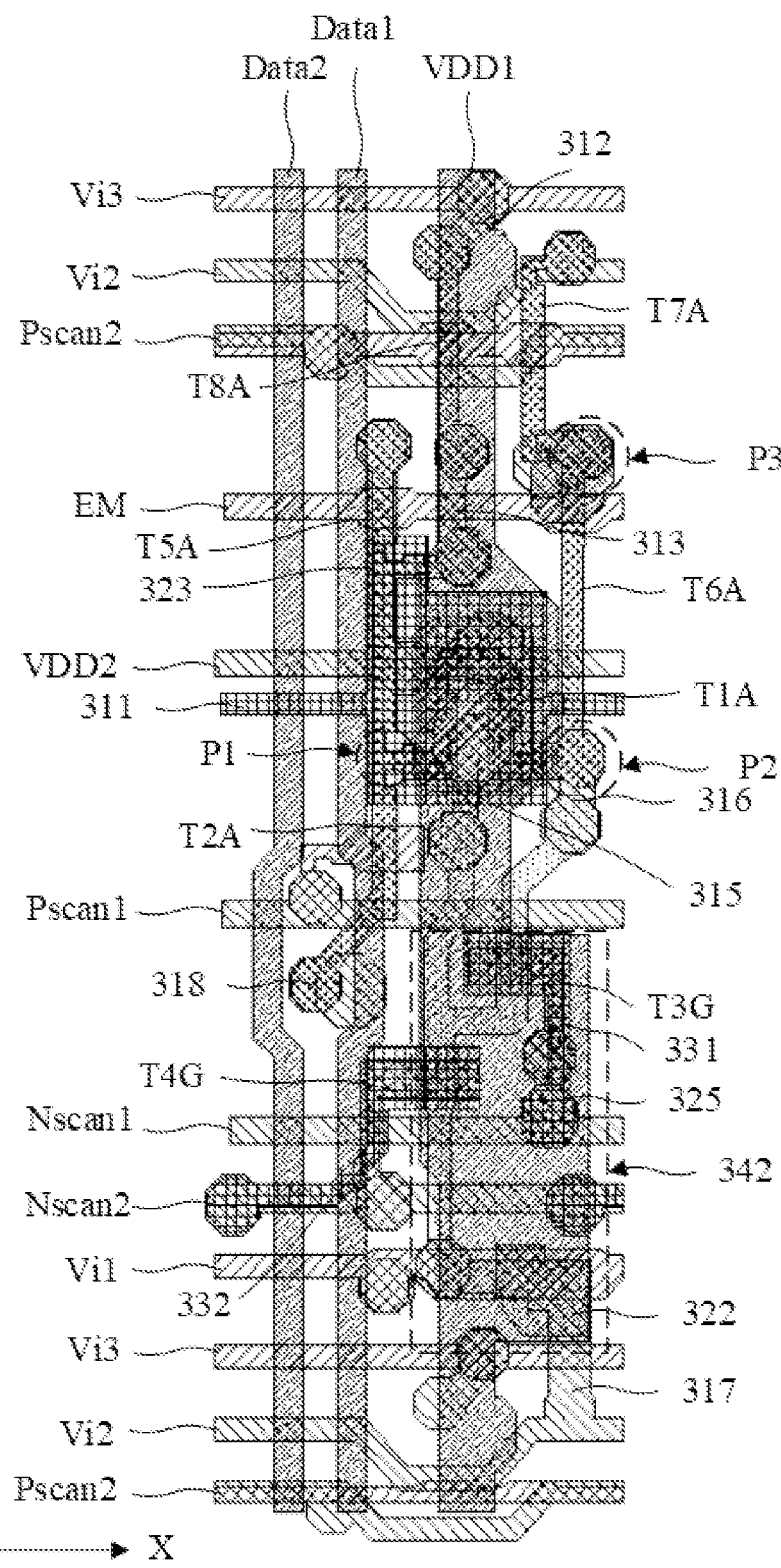
FIG. 25 is a third type of laminated film layer diagram of the pixel driving circuit in the present application.

Referring to FIGS. 23 to 25, compared to FIGS. 20 to 22, the longitudinal width of the second sub-plate 342 in this application is further increased, such that a portion of the first control signal line Nscan1 overlaps with the second sub-plate 342. The portion of the first control signal line Nscan1 that overlaps with the second sub-plate 342 acts as the third subpart of the first plate. An orthographic projection of the third subpart projected on the second source-drain layer 135 falls within the first high potential line VDD1.

By increasing the longitudinal width of the second sub-plate 342 to make the second sub-plate 342 cover the compensation gate T3G, the first conductive segment 331, and a portion of the first control signal line Nscan1 simultaneously, where the compensation gate T3G, the first conductive segment 331, and the portion of the first control signal line Nscan1 serve as the first plate, and the second sub-plate 342 serves as the second plate, the first plate and the second plate form the first capacitor C1. The increase in the relative area between the first plate and the second plate enhances the capacitance value of the first capacitor C1, thereby improving the stability of the control signal transmitted by the first control signal line Nscan1. This prevents abnormal activation of the compensation transistor T3, ensures the stability of the gate potential of the driving transistor T1, and addresses technical issues related to display anomalies in display panel 100. This strategic design choice contributes to improving the overall performance and reliability of the display.

Therefore, the first plate can be positioned in the third gate layer 131, or the first plate can be disposed in the first source-drain layer 133, or the first plate can be concurrently positioned in both the third gate layer 131 and the first source-drain layer 133, while the second plate is solely positioned in the second source-drain layer 135.

It should be noted that, in FIGS. 16 to 25, since the fifth extension segment 325 is connected to the first control signal line Nscan1 and overlaps with the second sub-plate 342, the fifth extension segment 325 can also act as the fourth subpart of the first plate. This means an orthographic projection of the fourth subpart projected on the first high potential line VDD1 falls within the second sub-plate 342.

It should be noted that, in FIGS. 16 to 25, since the area of the first shading unit T3S is larger than the area of the compensation gate T3G, and the first shading unit T3S can be electrically connected to the first control signal line Nscan1, a capacitor is also formed between a portion of the first shading unit T3S that extends beyond the compensation gate T3G and the second sub-plate 342. The portion of the first shading unit T3S that extends beyond the compensation gate T3G can act as a part of the first sub-plate 341.

It should be mentioned that in FIGS. 16 to 22, a portion of the third subpart overlaps with the first control signal line Nscan1. This overlapping part can act as a segment of both the first plate and the second plate.

Moreover, when the first high potential line VDD1 does not cover the compensation gate T3G and the first conductive segment 331, there exists a small area of overlap between the first control signal line Nscan1 and the first high potential line VDD1. A first capacitance value of the first capacitor C1 between the first control signal line Nscan1 and the first high potential line VDD1 can be 7.3 fF, while a second capacitance value between the data line and the first control signal line Nscan1 is 1.05 fF. Taking the second source-drain layer 135 in FIGS. 22 and 23 as examples, when the first high potential line VDD1 does not cover the compensation gate T3G, the first conductive segment 331, and a portion of the first control signal line Nscan1, the area of the first plate increases, raising the first capacitance value of the first capacitor C1 between the first high potential line VDD1 and the first control signal line Nscan1 to 14.2 fF, while the second capacitance value between the data line and the first control signal line Nscan1 remains at 1.05 fF. Therefore, compared to existing technology, a ratio of the second capacitance value to the first capacitance value (C1) in this application decreases from 14.38% to 7.4%, enhancing the anti-coupling capability of the first control signal line Nscan1, and thereby improving the stability of the control signal transmitted by the first control signal line Nscan1.

Figure 26:
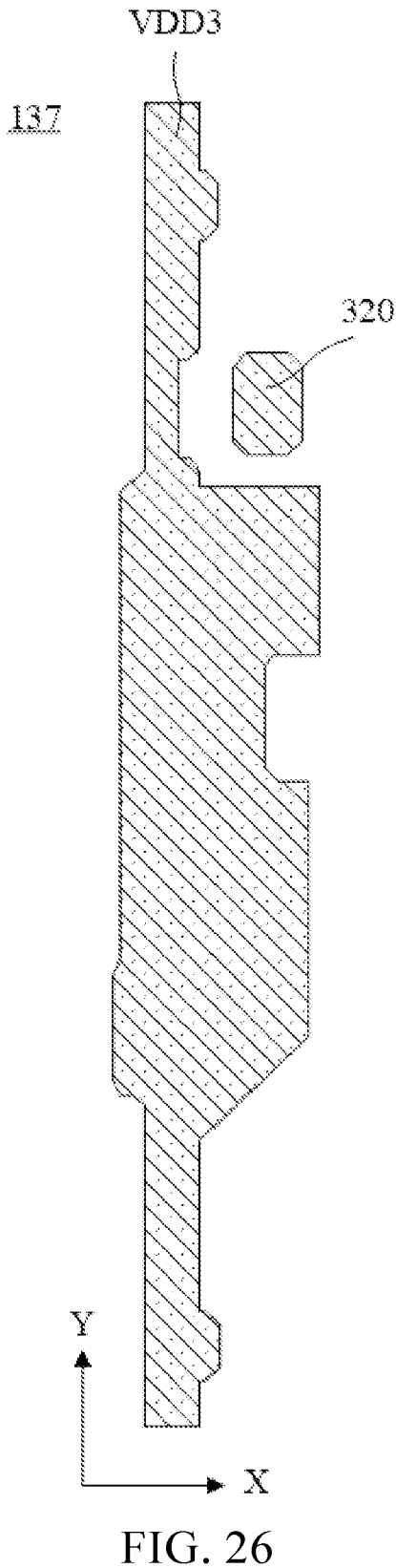
FIG. 26 is a film layer diagram of a third source-drain layer in the display panel of the present application.
Figure 27:
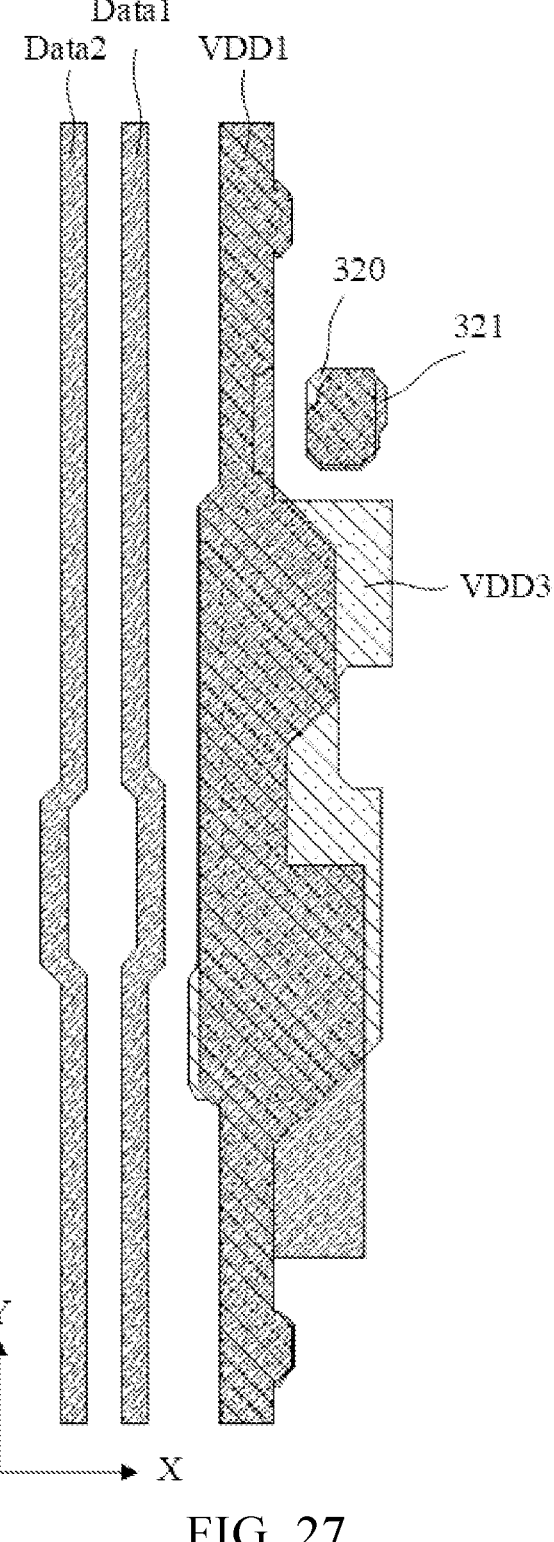
FIG. 27 is a laminated film layer diagram of the second source-drain layer and the third source-drain layer in the display panel of the present application.
Figure 28:
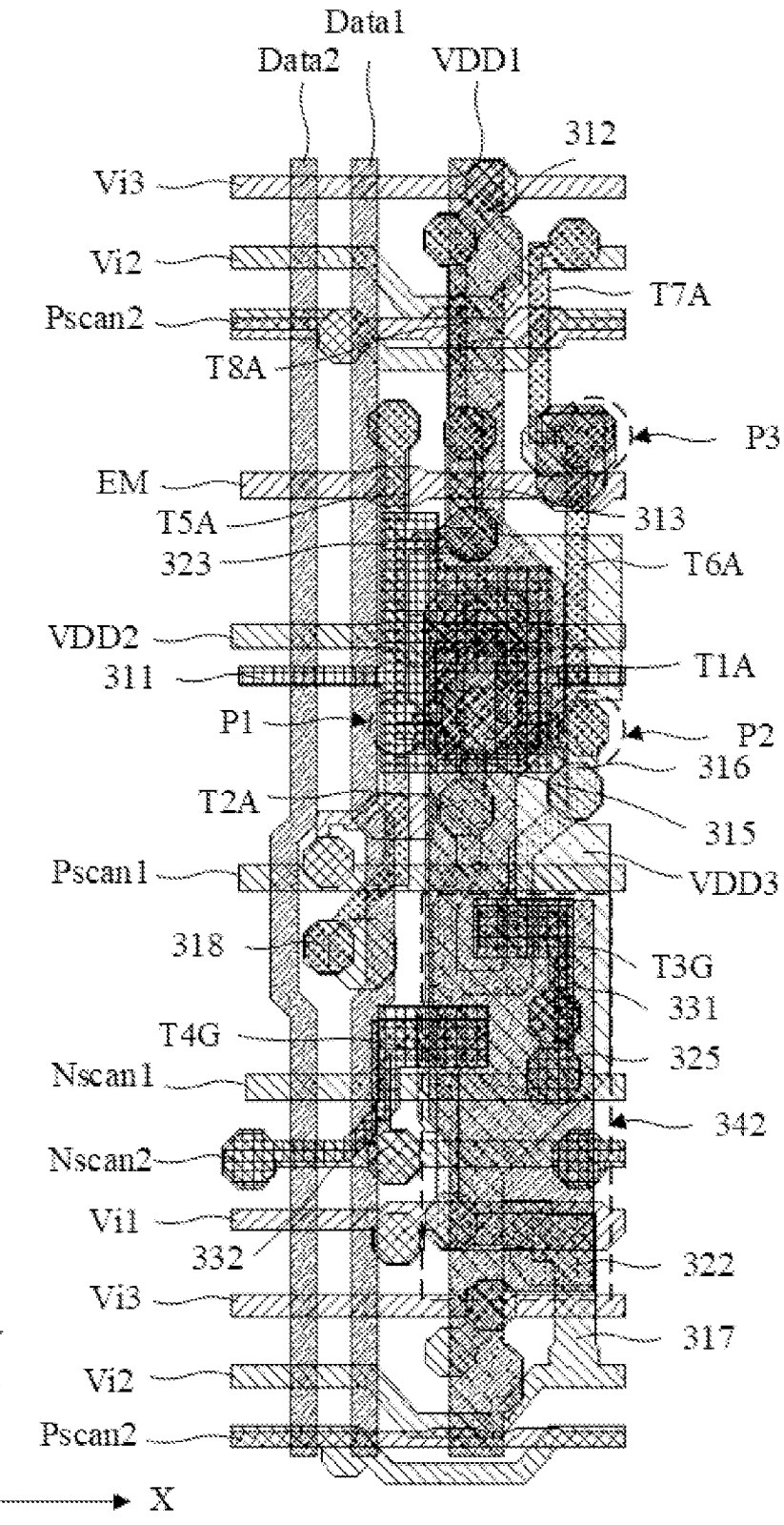
FIG. 28 is a fourth type of laminated film layer diagram of the pixel driving circuit in the present application.

Referring to FIGS. 26 and 28, the third source-drain layer 137 can include a third high potential line VDD3. The third high potential line VDD3 extends along the second direction Y and is electrically connected to the second high potential line VDD2. The implementation of the third high potential line VDD3 primarily aims to reduce the impedance of the wiring that transmit a constant high voltage level.

It should be noted that, in FIGS. 16 to 26, the first high potential line VDD1 of this application can be electrically connected to the second high potential line VDD2. Subsequently, the second high potential line VDD2 is electrically connected to the fourth plate Cst2 of the storage capacitor Cst, and the fourth plates Cst2 located in the same row are interconnected via the first electrical connection segments 311. Therefore, the conductors in this application used for transmitting a constant high voltage level comprise four layers of metal, which include the fourth plate Cst2 and the first electrical connection segment 311 located in the second gate layer 127, the second high potential line VDD2 in the first source-drain layer 133, the first high potential line VDD1 in the second source-drain layer 135, and the third high potential line VDD3 in the third source-drain layer 137. The fourth plate Cst2, the first electrical connection segment 311, and the second high potential line VDD2 all extend along the first direction X, while the first high potential line VDD1 and the third high potential line VDD3 extend along the second direction Y Thus, by utilizing four layers of metal to transmit the constant high voltage level and forming a grid-like metal mesh that interlaces vertically and horizontally, this application aims to reduce the impedance of the wiring, thereby minimizing the loss of the constant high voltage level across the transmitted wiring.

Figure 29:
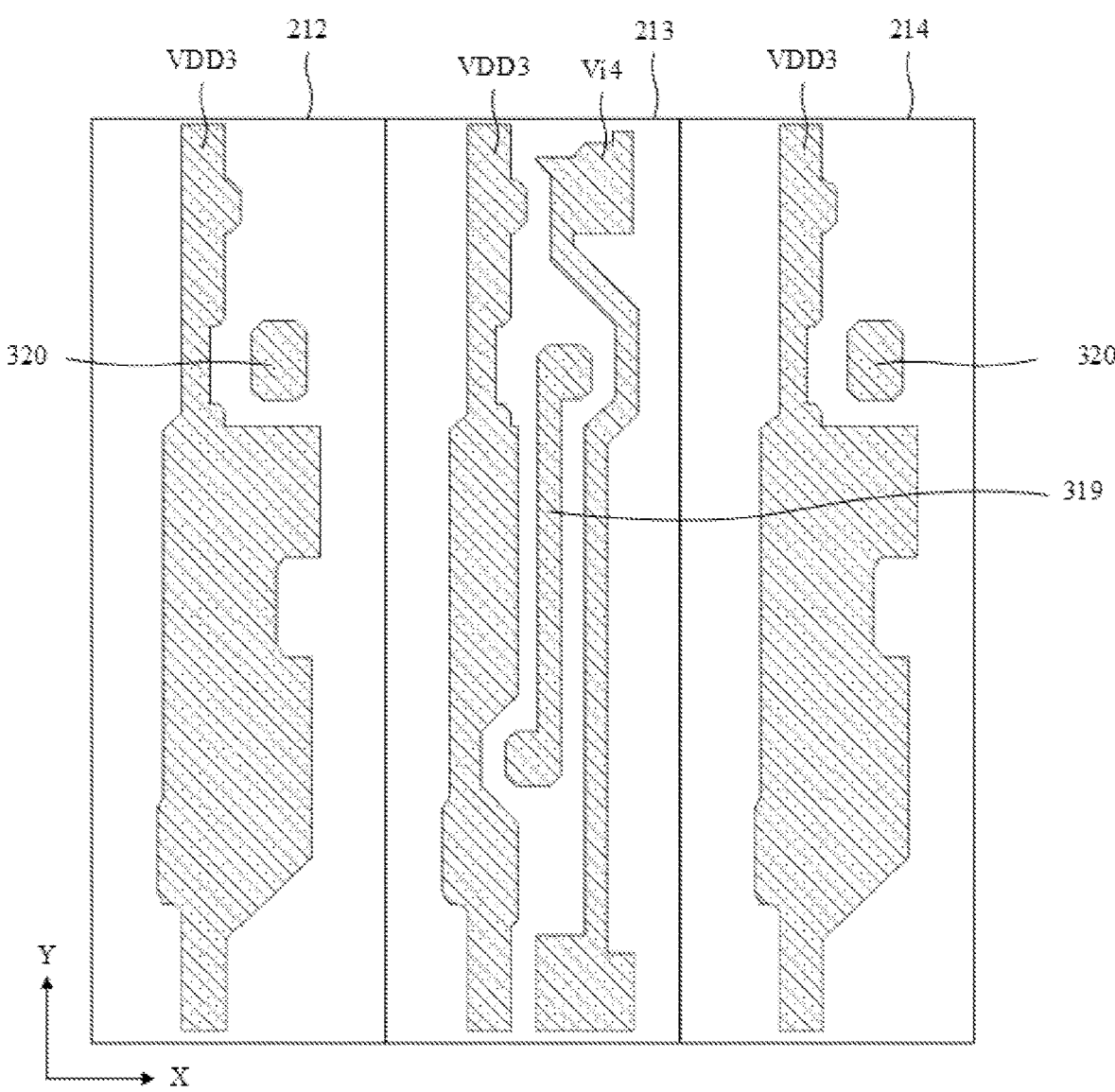
FIG. 29 is a film layer diagram of the third source-drain layer across multiple sub-pixel units in the display panel of the present application.
Figure 30:
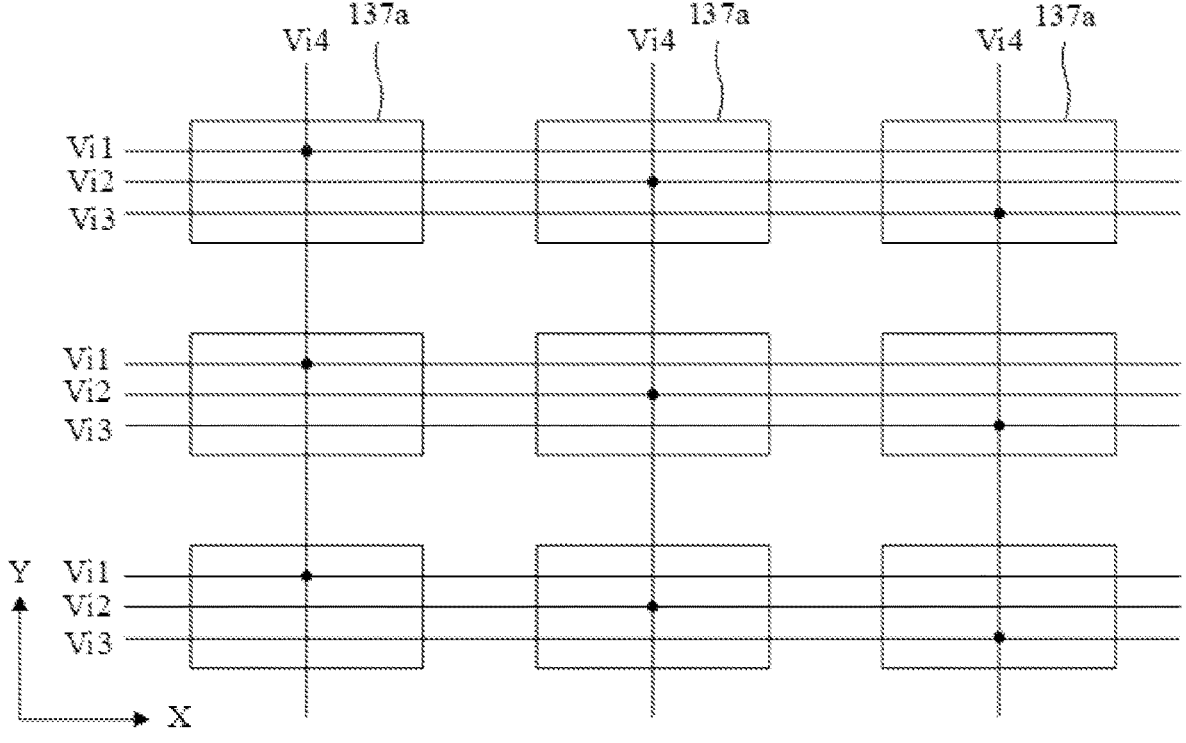
FIG. 30 is a connection diagram of a first reset signal line, a second reset signal line, a third reset signal line, and a fourth reset signal line in the display panel of the present application.

Referring to FIG. 29, the third source-drain layer 137 of this application includes a plurality of repeating units 137*a*, each corresponding to three adjacent sub-pixel units 211 arranged along the first direction X. For example, these three sub-pixel units 211 can be designated as the first sub-pixel unit 212, the second sub-pixel unit 213, and the third sub-pixel unit 214. Each repeating unit 137*a* can comprise three high potential lines VDD3, wherein the initial third high potential lines VDD3 corresponds to the first sub-pixel unit 212, the final third high potential lines VDD3 corresponds to the third sub-pixel unit 214, and the middle third high potential line VDD3 corresponds to the second sub-pixel unit 213 and the fourth reset signal line Vi4. The structure of the initial and final third high potential lines VDD3 can be the same, whereas the structure of the middle third high potential line VDD3 differs from the structure of the final third high potential line VDD3, with a lateral width of the middle third high potential line VDD3 being less than a lateral width of the final third high potential line VDD3.

Referring to FIG. 29, where each repeating unit 137*a* contains one longitudinal reset signal line and three horizontal reset signal lines. To reduce the impedance of the reset signal lines, the longitudinal reset signal line can be electrically connected to one of the three horizontal reset signal lines. For example, in FIG. 30, there are 3 rows of repeating units 137*a*, with each row comprising 3 repeating units 137*a*. Each repeating unit 137*a* contains one fourth reset signal line Vi4. The fourth reset signal line Vi4 in the first repeating unit 137*a* can be electrically connected to the first reset signal line Vi1 in each row, the fourth reset signal line Vi4 in the second repeating unit 137*a* can be electrically connected to the second reset signal line Vi2 in each row, and the fourth reset signal line Vi4 in the third repeating unit 137*a* can be electrically connected to the third reset signal line Vi3 in each row. This arrangement allows each horizontal reset signal line to be electrically connected to the fourth reset signal line Vi4, forming a crisscrossing metal mesh that reduces the impedance of the reset signal lines.

It should be noted that in FIG. 29, the first sub-pixel unit 212, the second sub-pixel unit 213, and the third sub-pixel unit 214 merely represent the locations of the pixel driving circuits 211*a* of the corresponding sub-pixel units 211, and the positions of the anodes within the sub-pixel units 211 may not be within the corresponding areas. For instance, referring to FIG. 31, where the pixel driving circuit 211*a* in the first sub-pixel unit 212 is electrically connected to a first anode 211*bl*, and the pixel driving circuit 211*a* in the second sub-pixel unit 213 is connected to a second anode 211*b*2. The first anode 211*b*1 and the second anode 211*b*2 are arranged along the second direction Y and span across both the first sub-pixel unit 212 and the second sub-pixel unit 213.

Figure 31:
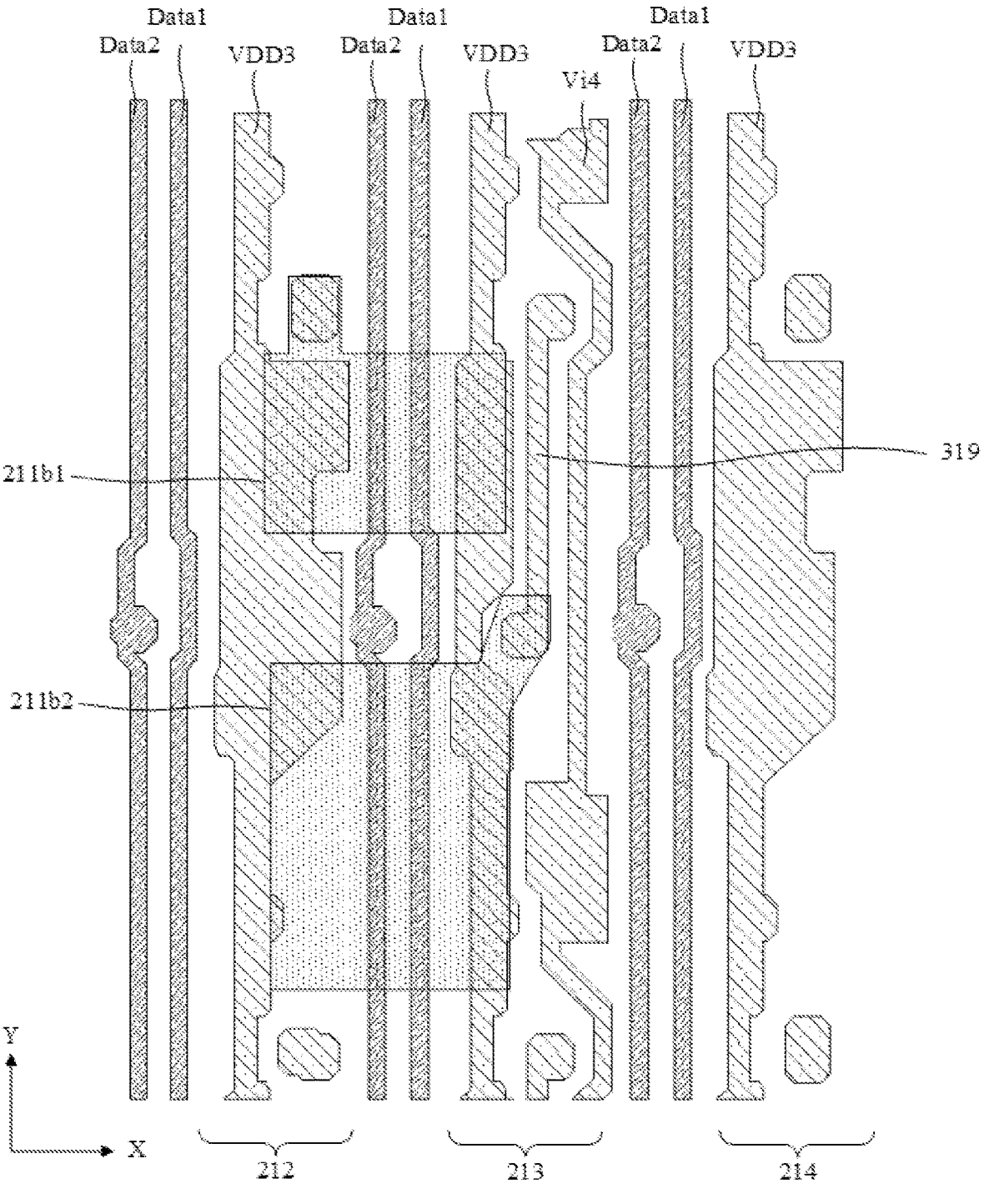
FIG. 31 is a laminated film layer diagram of the third source-drain layer, a data signal line, and an anode of a light-emitting device in the display panel of the present application.

It should be noted that in FIG. 31, the third source-drain layer 137 can also include a ninth electrical connection segment 319 and a tenth electrical connection segment 320. The ninth electrical connection segment 319 is positioned between the fourth reset signal line Vi4 and the middle third high potential line VDD3, while the tenth electrical connection segment 320 is located on one side of the initial and final third high potential lines VDD3, and the tenth electrical connection segment 320 corresponds to the fourth electrical connection segment 314. Additionally, the second source-drain layer 135 can include an eleventh electrical connection segment 321. The second anode 211*b*2 can be electrically connected to the third connection point P3, which is located in the first active layer 123 of the pixel driving circuit 211*a* in the second sub-pixel unit 213, through the ninth electrical connection segment 319, the eleventh electrical connection segment 321, the fourth electrical connection segment 314 in the second sub-pixel unit 213. Similarly, the first anode 211*b*1 can be connected to the third connection point P3, which is located in the first active layer 123 of the pixel driving circuit 211*a* in the first sub-pixel unit 212, through the tenth electrical connection segment 320, the eleventh electrical connection segment 321, and the fourth electrical connection segment 314 in the first sub-pixel unit 212. Likewise, the manner of connection for the anode in the third sub-pixel unit 314 follows the same pattern as the connection method used for the first anode 211*b*1.

The present application further provides a display device that includes the display panel as described above. The display device can be used in a variety of products or components with display functionality, such as smartphones, tablets, televisions, monitors, laptops, digital photo frames, navigators, and more.

In the embodiments described above, each embodiment has its emphasis, and parts not detailed in one embodiment can refer to the relevant descriptions in other embodiments.

The detailed description provided above introduces a display panel and a display device according to the present application. Specific examples have been used to describe the principles and implementation methods of this application. The explanations of these embodiments are intended to aid in understanding the technical solution and core ideas of this application. Those of ordinary skill in the art should understand that they can still modify the technical solutions described in the aforementioned embodiments, or equivalently replace some of the technical features within them. These modifications or replacements do not deviate from the essence of the technical solutions of the embodiments of this application and remain within the scope of the technical solutions.

What is claimed is:
1. A display panel, comprising:
a plurality of sub-pixel units, each of the sub-pixel units
    comprising a light-emitting device and a pixel driving
    circuit connected to the light-emitting device, wherein
    each of the pixel driving circuits comprises:

a switch transistor, wherein a first electrode of the switch transistor is connected to a first data signal line, and a second electrode of the switch transistor is connected to a first node;

a driving transistor, wherein a first electrode of the driving transistor is connected to the first node, a second electrode of the driving transistor is connected to a second node, and a drive gate of the driving transistor is connected to a third node;

a compensation transistor, wherein a first electrode of the compensation transistor is connected to the third node, a second electrode of the compensation transistor is connected to the second node, and a compensation gate of the compensation transistor is connected to a first control signal line; and a first capacitor, wherein a first plate of the first capacitor is connected to the first control signal line, and a second plate of the first capacitor is connected to a first high potential line, wherein the first high potential line comprises the first sub-plate and the second sub-plate, arranged along the second direction; an orthographic projection of the drive gate projected on the first high potential line is located within the first sub-plate, while an orthographic projection of the first plate projected on the first high potential line is located within the second sub-plate;

wherein in the second direction, a width of the second sub-plate is greater than a width of the first sub-plate.

2. The display panel according to claim 1, further comprising:

a base substrate;

a first gate layer, disposed on one side of the base substrate;

a second gate layer, disposed on one side of the first gate layer away from the base substrate;

a third gate layer, disposed on one side of the second gate layer away from the first gate layer;

a first source-drain layer, disposed on one side of the third gate layer away from the second gate layer; and a second source-drain layer, disposed on one side of the first source-drain layer away from the third gate layer;

wherein the first plate is disposed in at least one of the third gate layer and the first source-drain layer, and the second plate is disposed in the second source-drain layer.

3. The display panel according to claim 2, wherein the second source-drain layer comprises a plurality of first high potential lines arranged along a first direction and extending along the second direction, the third gate layer comprises the compensation gate and a first conductive segment, one end of the first conductive segment is electrically connected to the compensation gate, and another end of the first conductive segment is electrically connected to the first control signal line;

wherein the compensation gate serves as a first subpart of the first plate, an orthographic projection of the first subpart projected on the second source-drain layer is located within the first high potential line, and an angle between the first direction and the second direction is greater than 0 and less than or equal to 90 degrees.

4. The display panel according to claim 3, wherein the first conductive segment serves as a second subpart of the first plate, and an orthographic projection of the second subpart projected on the second source-drain layer is located within the first high potential line.

5. The display panel according to claim 4, wherein the first source-drain layer comprises the first control signal line and a second control signal line, both the first control signal line and the second control signal line extend along the first direction, the first control signal line and the second control signal line are arranged spaced apart along the second direction, and the second control signal line is connected to a switch gate of the switch transistor;

wherein both the compensation gate and the first conductive segment are disposed between the first control signal line and the second control signal line, the compensation gate extends along the first direction, and the first conductive segment extends along the second direction.

6. The display panel according to claim 5, wherein the first control signal line comprises a third subpart of the first plate, and an orthographic projection of the third subpart projected on the second source-drain layer is located within the first high potential line.

7. The display panel according to claim 6, wherein the first source-drain layer further includes a fourth subpart of the first plate, the fourth subpart extends along the second direction, one end of the fourth subpart is electrically connected to the first control signal line, and another end of the fourth subpart is electrically connected to the second subpart;

wherein an orthographic projection of the fourth subpart projected on the second source-drain layer is located within the first high potential line.

8. The display panel according to claim 1, wherein the pixel driving circuit further comprises:

a storage capacitor, comprising a third plate and a fourth plate, wherein the third plate is connected to the third node, and the fourth plate is connected to the first high potential line;

a first reset transistor, wherein a first electrode of the first reset transistor is connected to a first reset signal line, and a second electrode of the first reset transistor is connected to the third node;

a second reset transistor, wherein a first electrode of the second reset transistor is connected to a second reset signal line, and a second electrode of the second reset transistor is connected to an anode of the light-emitting device;

a third reset transistor, wherein a first electrode of the third reset transistor is connected to a third reset signal line, and a second electrode of the third reset transistor is connected to the first node;

a first light-emitting transistor, wherein a first electrode of the first light-emitting transistor is connected to the first high potential line, and a second electrode of the first light-emitting transistor is connected to the first node, and a gate of the first light-emitting transistor is connected to a light-emitting signal line;

a second light-emitting transistor, wherein a first electrode of the second light-emitting transistor is connected to the second node, a second electrode of the second light-emitting transistor is connected to an anode of the light-emitting device, and a gate of the second light-emitting transistor is connected to the light-emitting signal line; and a boost capacitor, comprising a fifth plate and a sixth plate, wherein the fifth plate is connected to the third node, and the sixth plate is connected to the second control signal line.

9. The display panel according to claim 8, wherein a capacitance value of the first capacitor is less than a capacitance value of the storage capacitor, and the capacitance value of the boost capacitor is less than the capacitance value of the storage capacitor.

10. The display panel according to claim 8, wherein a first gate layer of the display panel comprises a light-emitting signal line, a first reset signal line, a third reset signal line, and a fourth control signal line; the light-emitting signal line, the first reset signal line, the third reset signal line, and the fourth control signal line all extend along the first direction; and the third reset signal line, the fourth control signal line, the light-emitting signal line, and the first reset signal line are arranged at intervals along the second direction.

11. The display panel according to claim 10, wherein a first active layer of the display panel comprises a switch active part of the switch transistor, a drive active part of the driving transistor, a second reset active part of the second reset transistor, a third reset active part of the third reset transistor, a first light-emitting active part of the first light-emitting transistor, and a second light-emitting active part of the second light-emitting transistor;

wherein the switch active part, the drive active part, the second reset active part, the first light-emitting active part, and the second light-emitting active part are interconnected; the switch active part, the second reset active part, the third reset active part, the first light-emitting active part, and the second light-emitting active part extend along the second direction; and the drive active part is disposed between the first light-emitting active part and the second light-emitting active part.

12. The display panel according to claim 11, wherein a second gate layer of the display panel comprises a fourth plate of the storage capacitor, a first shading unit of the compensation transistor, and a second shading unit of the first reset transistor, arranged along the second direction; the fourth plate, the first shading unit, and the second shading unit are disposed between the light-emitting signal line and the first reset signal line; the third plate is disposed close to the light-emitting signal line, and the second shading unit is disposed close to the first reset signal line; and the first shading unit is located between the second shading unit and the fourth plate.

13. The display panel according to claim 12, wherein the second gate layer further comprises two first electrical connection segments disposed on two sides of the fourth plate, the two first electrical connection segments extend along the first direction, and in two adjacent ones of the sub-pixel units arranged along the first direction, the fourth plates in the two adjacent sub-pixel units are electrically connected through the first electrical connection segment.

14. The display panel according to claim 12, wherein a second active layer of the display panel comprises a compensation active part of the compensation transistor and a first reset active part of the first reset transistor, both the compensation active part and the first reset active part extend along the second direction, a first end of the compensation active part is connected to a first end of the first reset active part, and a second end of the first reset active part extends towards the first reset signal line and overlaps with the first reset signal line.

15. The display panel according to claim 14, wherein the second active layer further comprises a first extension segment and a second extension segment connected to a second end of the first reset active part; the first extension segment extends along the second direction towards a location of the storage capacitor and is set apart from the storage capacitor; and the second extension segment extends along the first direction and at least partially overlaps with the first reset signal line.

16. The display panel according to claim 14, wherein a third gate layer of the display panel comprises a compensation gate of the compensation transistor and a first reset gate of the first reset transistor; an area of the compensation gate is smaller than an area of the first shading unit; an orthographic projection of the compensation gate projected on the first shading unit is located within the first shading unit; an area of the first reset gate is smaller than an area of the second shading unit; and an orthographic projection of the first reset gate projected on the second shading unit is located within the second shading unit.

17. The display panel according to claim 16, wherein the third gate layer further comprises a first conductive segment connected to the compensation gate, and a second conductive segment connected to the first reset gate; the first conductive segment extends along the second direction towards a side away from the compensation gate; and the second conductive segment extends along the second direction towards a side away from the first reset gate.

18. The display panel according to claim 17, wherein the first source-drain layer of the display panel comprises the second reset signal line, a fifth control signal line, a second high potential line, the second control signal line, the first control signal line, and a third control signal line, arranged along the second direction; the second reset signal line, the fifth control signal line, the second high potential line, the second control signal line, the first control signal line, and the third control signal line all extend along the first direction.

19. A display device, comprising a display panel, wherein the display panel comprises a plurality of sub-pixel units, and each of the sub-pixel units comprises a light-emitting device and a pixel driving circuit connected to the light-emitting device, wherein each of the pixel driving circuits comprises:

a switch transistor, wherein a first electrode of the switch transistor is connected to a first data signal line, and a second electrode of the switch transistor is connected to a first node;

a driving transistor, wherein a first electrode of the driving transistor is connected to the first node, a second electrode of the driving transistor is connected to a second node, and a drive gate of the driving transistor is connected to a third node;

a compensation transistor, wherein a first electrode of the compensation transistor is connected to the third node, a second electrode of the compensation transistor is connected to the second node, and a compensation gate of the compensation transistor is connected to a first control signal line;

a first capacitor, wherein a first plate of the first capacitor is connected to the first control signal line, and a second plate of the first capacitor is connected to a first high potential line, wherein the first high potential line comprises the first sub-plate and the second sub-plate, arranged along the second direction; an orthographic projection of the drive gate projected on the first high potential line is located within the first sub-plate, while an orthographic projection of the first plate projected on the first high potential line is located within the second sub-plate; and wherein in the second direction, a width of the second sub-plate is greater than a width of the first sub-plate.

20. A display panel, comprising:

a plurality of sub-pixel units, each of the sub-pixel units comprising a light-emitting device and a pixel driving circuit connected to the light-emitting device, wherein each of the pixel driving circuits comprises:

a switch transistor, wherein a first electrode of the switch transistor is connected to a first data signal line, and a second electrode of the switch transistor is connected to a first node;

a driving transistor, wherein a first electrode of the driving transistor is connected to the first node, a second electrode of the driving transistor is connected to a second node, and a drive gate of the driving transistor is connected to a third node;

a compensation transistor, wherein a first electrode of the compensation transistor is connected to the third node, a second electrode of the compensation transistor is connected to the second node, and a compensation gate of the compensation transistor is connected to a first control signal line;

a first capacitor, wherein a first plate of the first capacitor is connected to the first control signal line, and a second plate of the first capacitor is connected to a first high potential line;

a base substrate;

a first gate layer, disposed on one side of the base substrate;

a second gate layer, disposed on one side of the first gate layer away from the base substrate;

a third gate layer, disposed on one side of the second gate layer away from the first gate layer;

a first source-drain layer, disposed on one side of the third gate layer away from the second gate layer; and a second source-drain layer, disposed on one side of the first source-drain layer away from the third gate layer;

wherein the first plate is disposed in at least one of the third gate layer and the first source-drain layer, and the second plate is disposed in the second source-drain layer;

wherein the second source-drain layer comprises a plurality of first high potential lines arranged along a first direction and extending along the second direction, the third gate layer comprises the compensation gate and a first conductive segment, one end of the first conductive segment is electrically connected to the compensation gate, and another end of the first conductive segment is electrically connected to the first control signal line;

wherein the compensation gate serves as a first subpart of the first plate, an orthographic projection of the first subpart projected on the second source-drain layer is located within the first high potential line, and an angle between the first direction and the second direction is greater than 0 and less than or equal to 90 degrees.

* * * * *